(12) United States Patent
Kawakami et al.

(10) Patent No.: US 9,893,317 B2
(45) Date of Patent: Feb. 13, 2018

(54) BARRIER LAMINATE AND GAS BARRIER FILM

(71) Applicant: FUJIFILM Corporation, Tokyo (JP)

(72) Inventors: Hiroshi Kawakami, Minami-ashigara (JP); Akihito Amao, Minami-ashigara (JP); Akiko Hattori, Minami-ashigara (JP)

(73) Assignee: FUJIFILM Corporation, Tokyo (JP)

( * ) Notice: Subject to any disclaimer, the term of this patent is extended or adjusted under 35 U.S.C. 154(b) by 264 days.

(21) Appl. No.: 14/830,127

(22) Filed: Aug. 19, 2015

(65) Prior Publication Data

US 2015/0357599 A1 Dec. 10, 2015

Related U.S. Application Data

(63) Continuation of application No. PCT/JP2014/053828, filed on Feb. 19, 2014.

(30) Foreign Application Priority Data

Feb. 20, 2013 (JP) .................. 2013-030903

(51) Int. Cl.

| H01L 51/52 | (2006.01) |
| H01L 31/04 | (2014.01) |
| C08F 20/56 | (2006.01) |
| C08K 5/20 | (2006.01) |
| C08F 222/38 | (2006.01) |
| H01L 31/048 | (2014.01) |

(52) U.S. Cl.
CPC .......... *H01L 51/5256* (2013.01); *C08F 20/56* (2013.01); *C08F 222/385* (2013.01); *C08K 5/20* (2013.01); *H01L 31/0481* (2013.01); *C08K 2201/008* (2013.01); *H01L 2251/301* (2013.01); *Y10T 428/31507* (2015.04); *Y10T 428/31587* (2015.04); *Y10T 428/31598* (2015.04)

(58) Field of Classification Search
CPC ............. H01L 51/5256; H01L 31/0481; H01L 2251/301; C08F 20/56; C08F 222/385; C08K 5/20; C08K 2201/008; Y10T 428/31507; Y10T 428/31587; Y10T 428/31598
USPC .......................................................... 428/522
See application file for complete search history.

(56) References Cited

U.S. PATENT DOCUMENTS

| 2,681,294 A | 6/1954 | Beguin | |
| 8,802,896 B2* | 8/2014 | Amao | C07C 217/28 |
| | | | 564/123 |
| 2004/0046497 A1 | 3/2004 | Schaepkens et al. | |
| 2012/0052272 A1* | 3/2012 | Iwase | C08J 7/045 |
| | | | 428/213 |

FOREIGN PATENT DOCUMENTS

| JP | 2006-289627 A | 10/2006 |
| JP | 2007-030387 A | 2/2007 |
| JP | 2012-206992 A | 10/2012 |
| JP | 2012-213938 A | 11/2012 |
| JP | 2012213938 A * | 11/2012 |

OTHER PUBLICATIONS

International Preliminary Report on Patentability and Written Opinion of the International Searching Authority (PCT/IB/326, PCT/IB/373, PCT/ISA/237 and PCT/IB/338) and English translation thereof dated Sep. 3, 2015 for Application No. PCT/JP2014/053828.
International Search Report issued in PCT/JP2014/053828, dated May 20, 2014.
Written Opinion issued in PCT/JP2014/053828, dated May 20, 2014.
Kim et al., "Transparent Hybrid Inorganic/Organic Barrier Coatings for Plastic Organic Light-Emitting Diode Substrates," Journal of Vacuum Science and Technology A, vol. 23, No. 4, Jul./Aug. 2005, pp. 971-977.

* cited by examiner

*Primary Examiner* — Michael M Bernshteyn
(74) *Attorney, Agent, or Firm* — Birch, Stewart, Kolasch & Birch, LLP

(57) ABSTRACT

The present invention provides a barrier laminate including at least one inorganic barrier layer and at least one organic layer, wherein the organic layer is a layer formed of a polymerizable composition comprising a polymerizable compound represented by general formula (1) below; and a gas barrier film including the barrier laminate and a support that preferably contains a resin consisting of a polymer or a copolymer comprising a cyclic olefin within a repeating unit or a polycarbonate resin:

General formula (1)

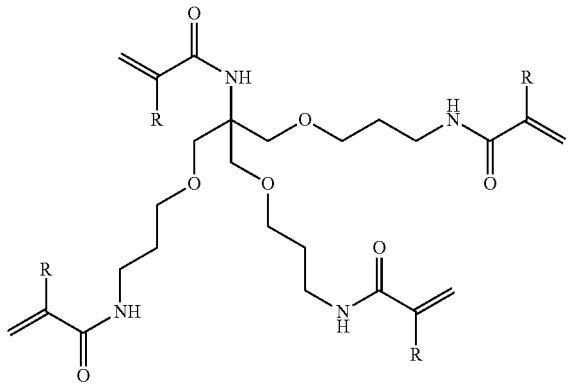

wherein R represents hydrogen atom or methyl group, and Rs may be the same or different to each other.

20 Claims, No Drawings

BARRIER LAMINATE AND GAS BARRIER FILM

CROSS-REFERENCE TO RELATED APPLICATIONS

This application is a continuation of PCT International Application No. PCT/JP2014/053828 filed on Feb. 19, 2014, which claims priority under 35 U.S.C § 119 (a) to Japanese Patent Application No. 2013-030903 filed on Feb. 20, 2013, the entire contents of which are incorporated herein by reference.

TECHNICAL FIELD

The present invention relates to a barrier laminate and a gas barrier film.

BACKGROUND ART

It is conventionally proposed (for example, Patent Literature 1) that a gas barrier film having, on a support, a barrier laminate including an inorganic barrier layer and an organic layer be used, as a film for blocking water vapor, oxygen and the like, for sealing or the like of an organic electronic device. Being lightweight and flexible, the gas barrier film has a wide application range. Furthermore, the reduction of the cost can be anticipated, because the gas barrier film can be produced by a Roll to Roll method.

CITATION LIST

Patent Literature

[Patent Literature 1] Japanese Unexamined Patent Application Publication No. 2012-213938

SUMMARY OF INVENTION

An object of the present invention is to provide a novel barrier laminate and a novel gas barrier film. In particular, an object of the present invention is to provide a barrier laminate that can provide a gas barrier film having a high barrier property even when a support having a low-retardation property is used.

The present inventors have conducted thorough studies in order to solve the above object and have found that a barrier laminate including an organic layer formed of a polymerizable composition containing a specific polymerizable compound can be combined with various types of supports to form a gas barrier film having a high barrier property and satisfactory handleability. The present invention has completed on the basis of the findings.

Specifically, the present invention provides <1> to <13> below.

<1> A barrier laminate including at least one inorganic barrier layer and at least one organic layer, wherein the organic layer is a layer formed of a polymerizable composition containing a polymerizable compound represented by general formula (1) below.

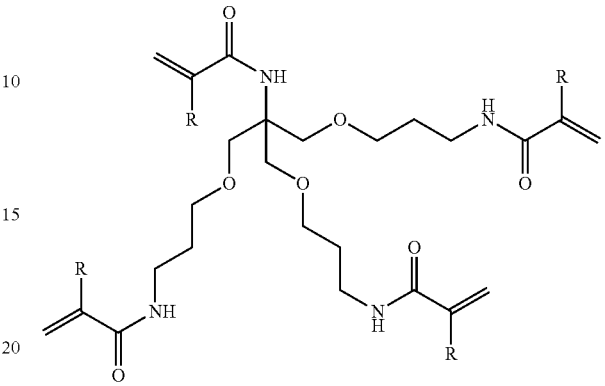

General formula (1)

(wherein R represents hydrogen atom or methyl group, and Rs may be the same or different to each other.)

<2> The barrier laminate according to <1>, wherein the inorganic barrier layer contains any one of metal compounds selected from a group consisting of a metal oxide, a metal nitride, a metal carbide, a metal oxynitride and a metal oxynitride carbide.

<3> The barrier laminate according to <1> or <2>, wherein the inorganic barrier layer contains a silicon compound.

<4> The barrier laminate according to any one of <1> to <3>, wherein a proportion of the polymerizable compound relative to the total amount of polymerizable compounds in the polymerizable composition is 60 mass % or more.

<5> The barrier laminate according to any one of <1> to <4>, wherein the organic layer and the inorganic barrier layer are adjacent to each other.

<6> A gas barrier film, wherein the barrier laminate of any one of <1> to <5> is provided on a support.

<7> The gas barrier film according to <6>, wherein the support contains a resin consisting of a polymer or a copolymer containing a cyclic olefin within a repeating unit or a polycarbonate resin.

<8> The gas barrier film according to <6> or <7>, wherein the support is adjacent to the organic layer.

<9> The gas barrier film according to <6> or <7>, wherein the support and the inorganic barrier layer are adjacent to each other, and the inorganic barrier layer and the organic layer are adjacent to each other.

<10> A device including the gas barrier film according to any one of <6> to <9>.

<11> The device according to <10>, wherein the device is an organic device for image display.

<12> A production method of the gas barrier film according to any one of <6> to <9>, the method including applying, on the support, an application liquid that contains: a polymerizable compound represented by general formula (1) below, and water, an alkyl alcohol having 1 to 3 carbon atoms, or a mixture of water and an alkyl alcohol having 1 to 3 carbon atoms.

General formula (1)

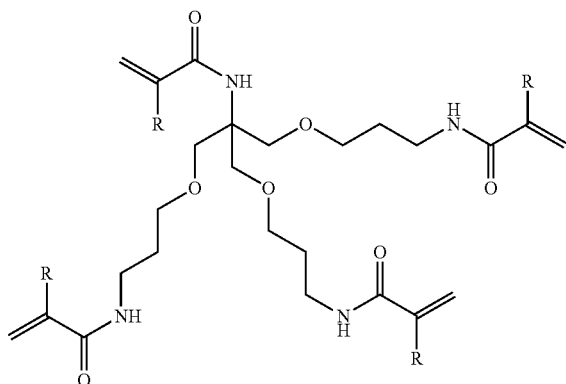

(wherein R represents hydrogen atom or methyl group, and Rs may be the same or different to each other.)

<13> The production method according to <12>, in which the application liquid contains water and an alkyl alcohol having 1 to 3 carbon atoms.

EFFECT OF THE INVENTION

The present invention provides a novel barrier laminate and a novel gas barrier film. The barrier laminate of the present invention enables formation of a gas barrier film having a high barrier property, even when a support having a low-retardation property is used. The present invention has made it possible to easily produce a barrier film having both a higher barrier performance and a higher retardation adjustment property.

MODES OF CARRYING OUT INVENTION

Hereinafter, the content of the present invention will be explained in detail.

In the present description, "to" is used in the sense that numerical values described before and after thereof are included as the value of lower limit and the value of upper limit. An "organic EL element" in the present invention denotes an organic electroluminescence element. In the description, (meth)acrylate is used in the sense including either or both of acrylate and methacrylate.

(Barrier Laminate)

The barrier laminate is a laminate having at least one organic layer and at least one inorganic barrier layer, or may also be a laminate having two or more organic layers and two or more inorganic barrier layers laminated alternately.

The barrier laminate may include a so-called gradient material layer in which a continuous change of an organic region and an inorganic region in the composition constituting the barrier laminate in the thickness direction is generated, within the range not departing from the gist of the present invention. Examples of the gradient materials include a material described in Journal of Vacuum Science and Technology A Vol. 23 p 971-977 (2005 American Vacuum Society) by Kim et al., a continuous layer in which an organic region and an inorganic region has no interface as disclosed in US Published Application No. 2004-46497 and the like. Hereinafter, for simplification, the organic layer and organic region are described as an "organic layer," and the inorganic layer and inorganic region are described as an "inorganic barrier layer."

The number of layers constituting the barrier laminate is not particularly limited, and, typically, 2 layers to 30 layers are preferable, and 3 layers to 20 layers are more preferable. In addition, a functional layer other than the organic layer and inorganic barrier layer may be included.

(Organic Layer)

The organic layer may contain an organic polymer as a main component. Here, the main component means that the first component of the components constituting the organic layer is an organic polymer, and normally means that 80 mass % or more of the components constituting the organic layer is an organic polymer.

Examples of the organic polymers include: thermoplastic resins such as polyester, acrylic resin, methacrylic resin, methacrylic acid-maleic acid copolymer, polystyrene, transparent fluororesin, polyimide, fluorinated polyimide, polyamide, polyamideimide, polyetherimide, cellulose acylate, polyurethane, polyether ether ketone, polycarbonate, alicyclic polyolefin, polyarylate, polyether sulfone, polysulfone, fluorene ring-modified polycarbonate, alicyclic-modified polycarbonate, fluorene ring-modified polyester and acryloyl compound; and organic silicon polymers such as polysiloxane. The organic layer may be formed of a single material, may be formed of a mixture or may have a multilayer structure of sublayers. In this case, the sublayers may have the same composition or have different compositions. As described above, the organic layer may be a layer in which the interface with the inorganic layer is not clear, and the composition continuously changes in the direction of the thickness of the film as disclosed in US Published Application No. 2004-46497.

The organic layer is preferably formed of a polymerizable composition containing a polymerizable compound, and is more preferably formed by curing a polymerizable composition containing a polymerizable compound.

The barrier laminate of the present invention includes at least one organic layer that is formed of a polymerizable composition containing a polymerizable compound represented by general formula (1) below.

General formula (1)

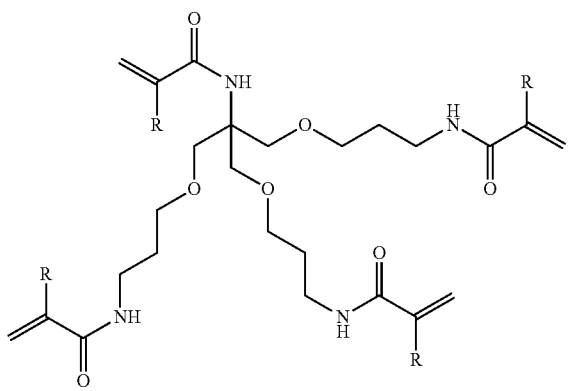

In the formula, R represents hydrogen atom or methyl group, and Rs may be the same or different to each other.

The compound represented by general formula (1) is the compound that is known in Japanese Unexamined Patent Application Publication No. 2012-206992, and synthesis, purification, identification and the like of the compound can be carried out by the method disclosed in the publication.

The polymerizable compound represented by general formula (1) may be contained in the polymerizable composition at the content of 50 mass % or more, and preferably 60 mass % or more relative to the total amount of the polymerizable compounds in the above-described polymerizable composition. The content of the polymerizable compound relative to the solid content (the remainder after volatilization of the volatile content) of the polymerizable composition may be 45 mass % or more, and preferably 55 mass % or more.

The polymerizable composition containing the polymerizable compound represented by the above-described general formula (1) may contain a polymerizable compound other than the polymerizable compound represented by general formula (1). At this time, the other polymerizable compound preferably includes the same polymerizable group as the polymerizable compound represented by general formula (1), namely, a (meth)acryloyl group. The barrier laminate may include an organic layer formed of a polymerizable composition that does not include the polymerizable compound represented by general formula (1) and that includes the other polymerizable compounds.

Specific examples of the other polymerizable compounds include compounds illustrated below, but the other polymerizable compound is not limited to these compounds.

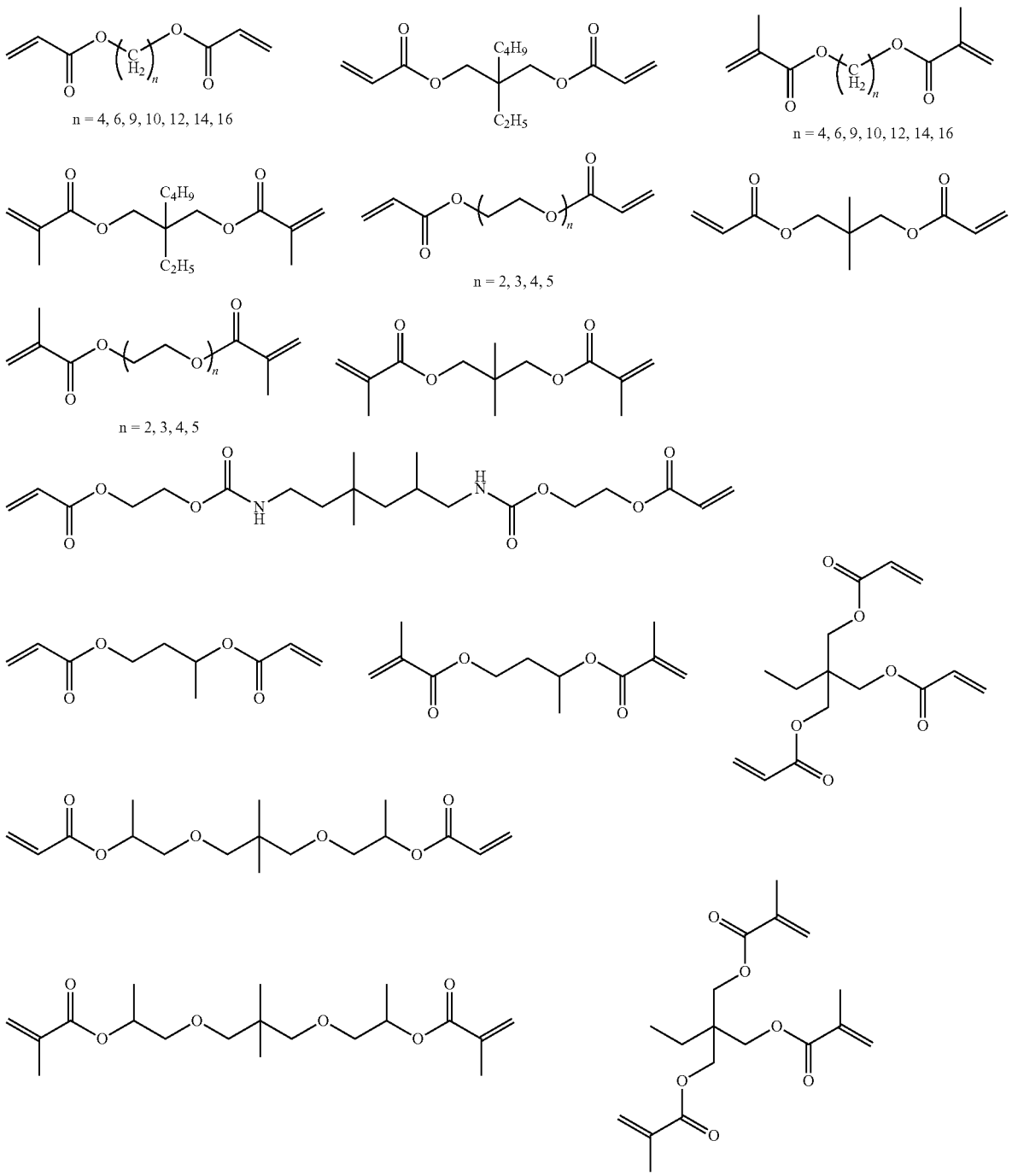

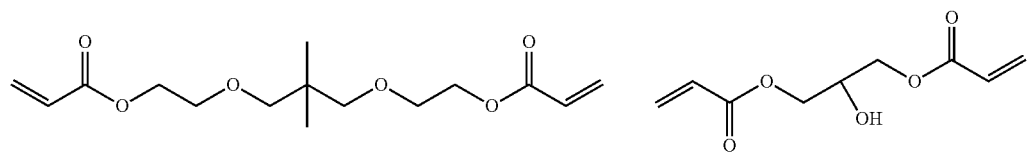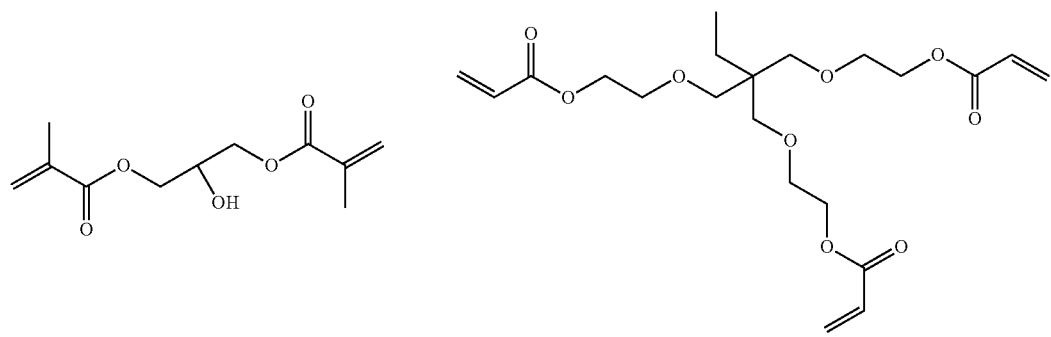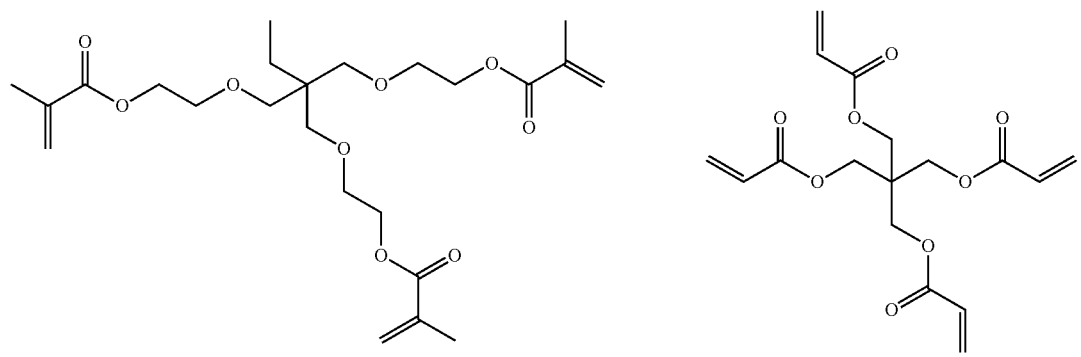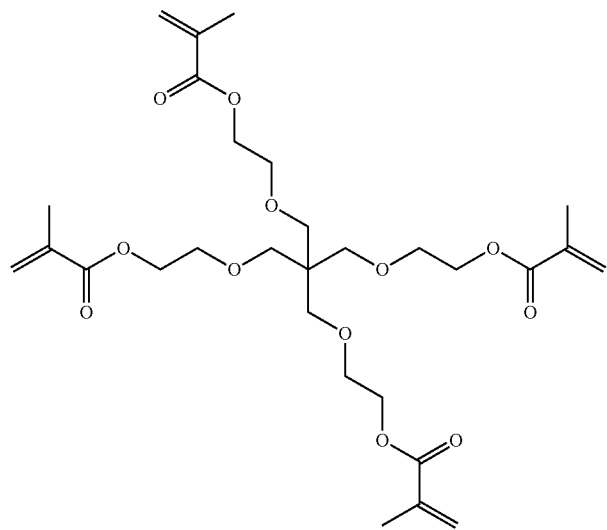

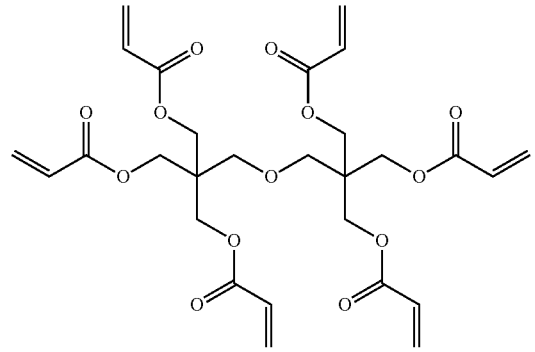
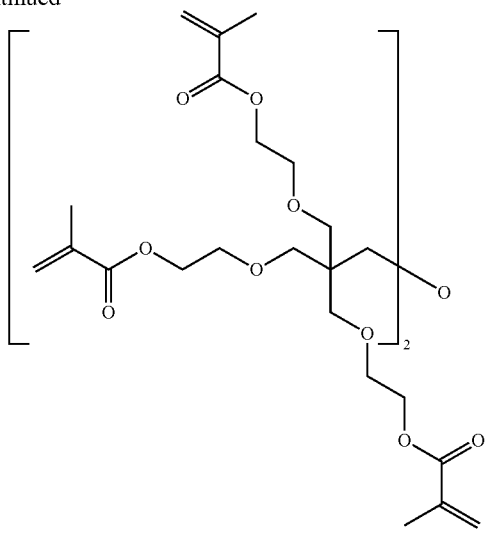
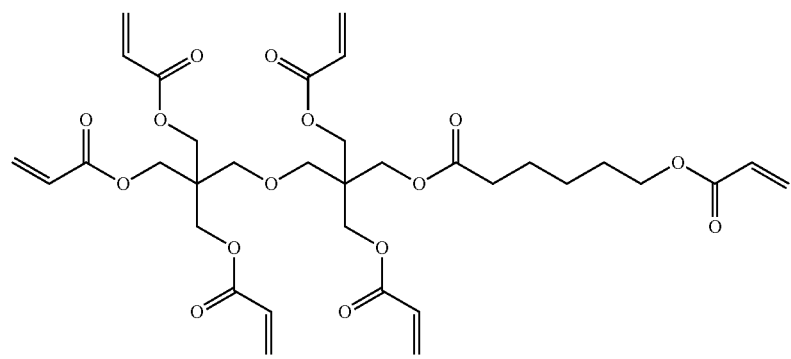
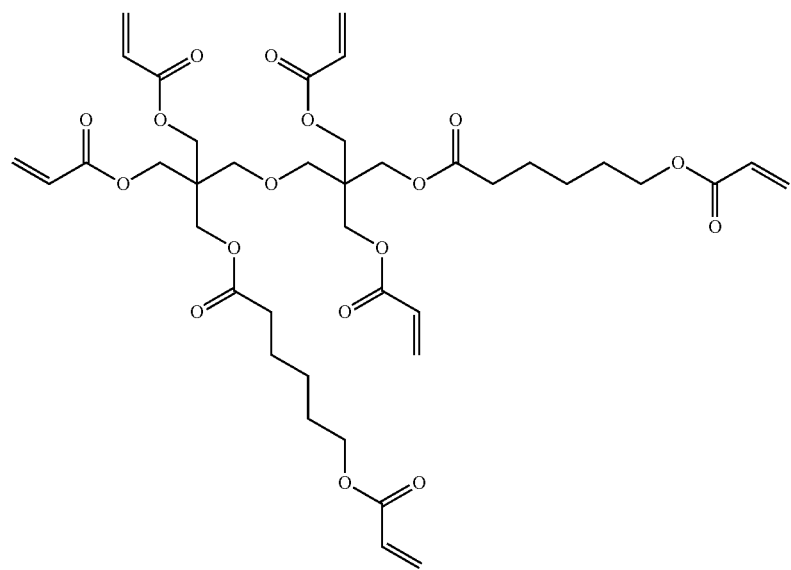

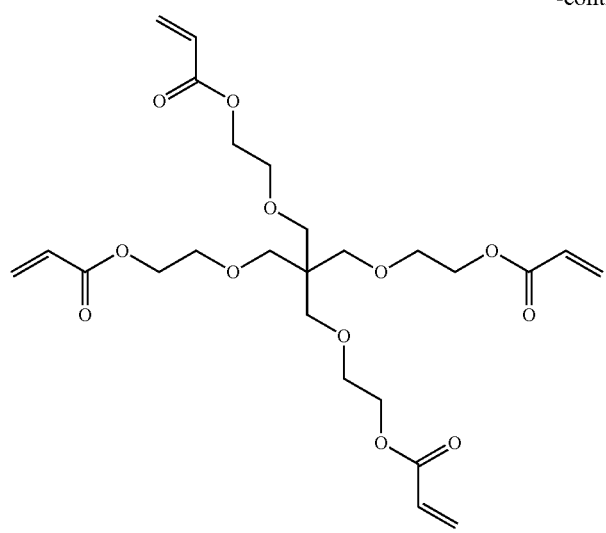
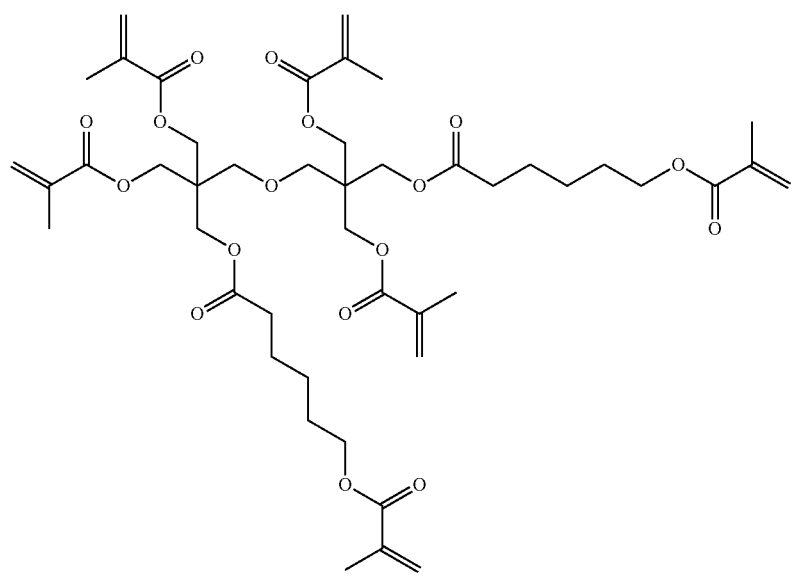
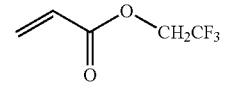
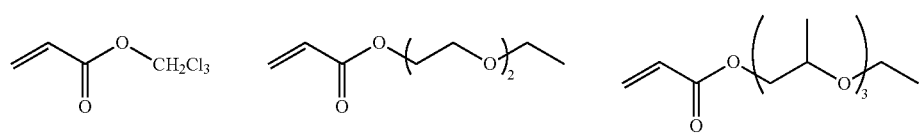
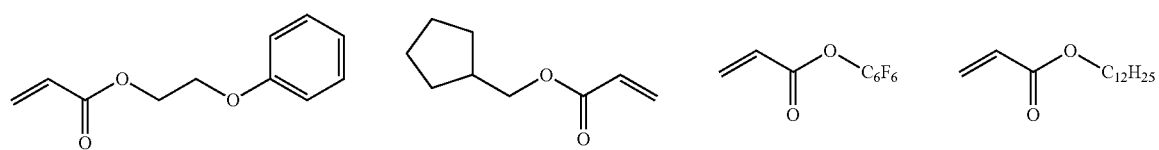

-continued
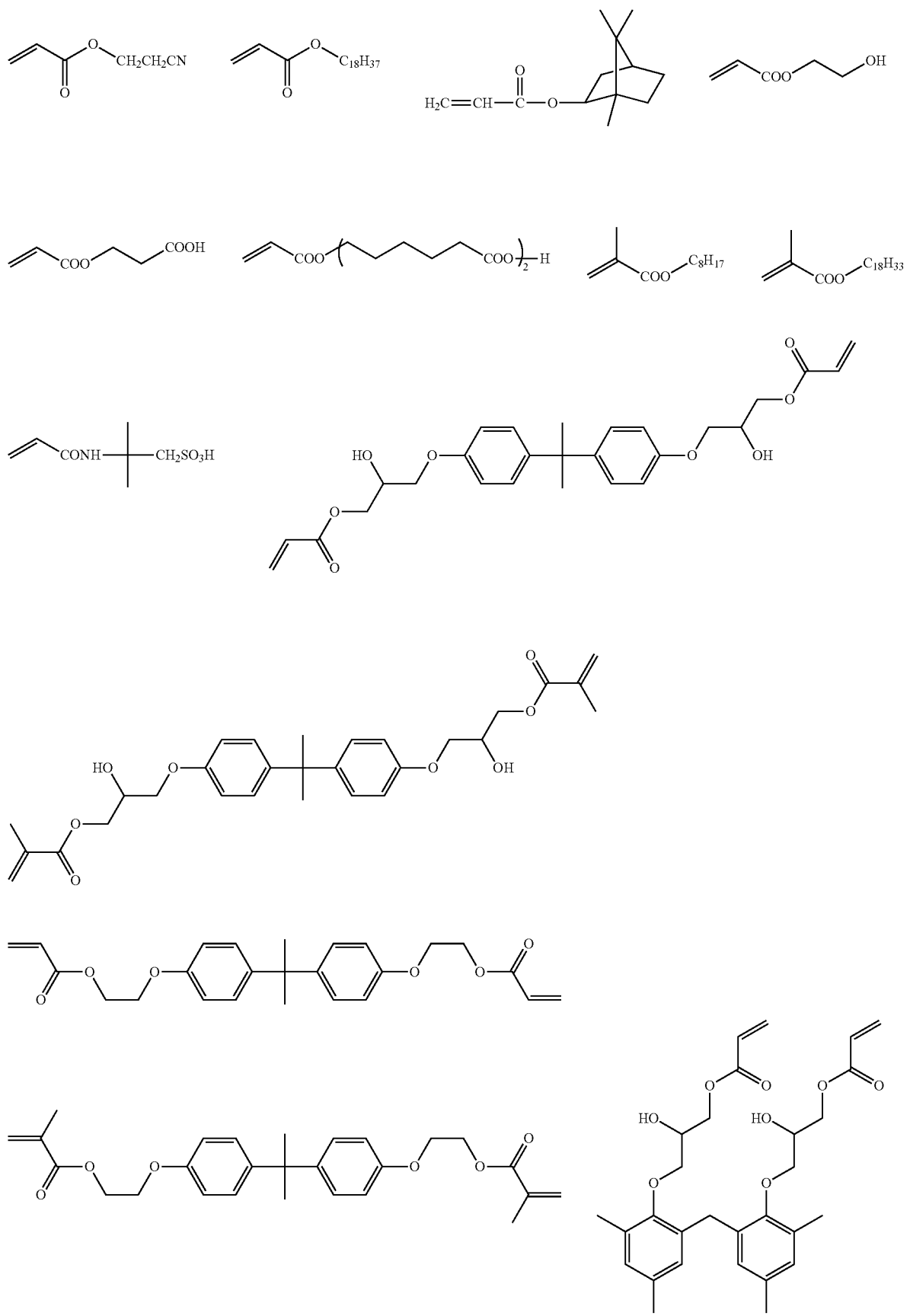

-continued
15
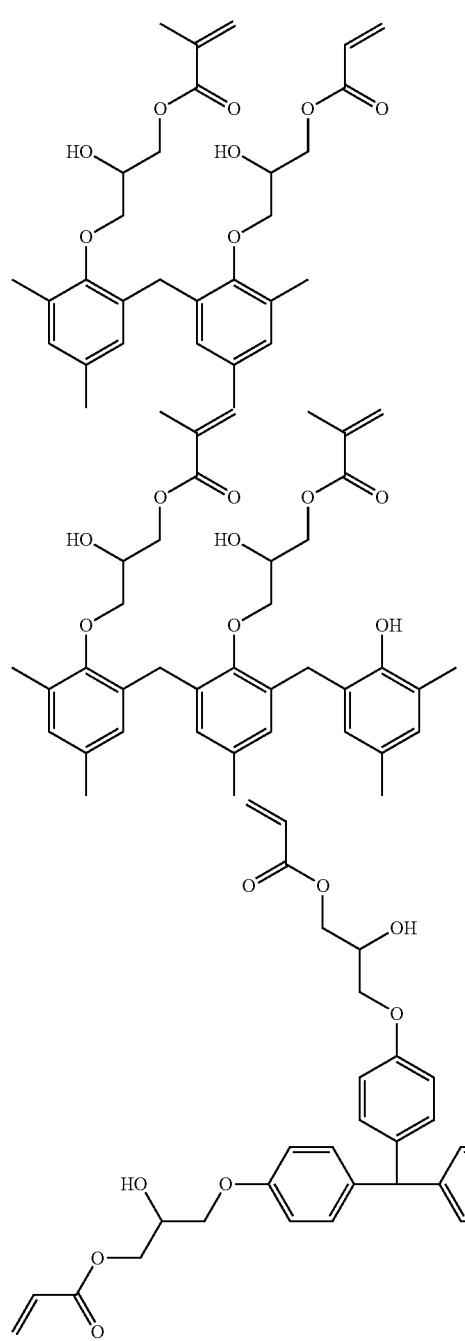
16
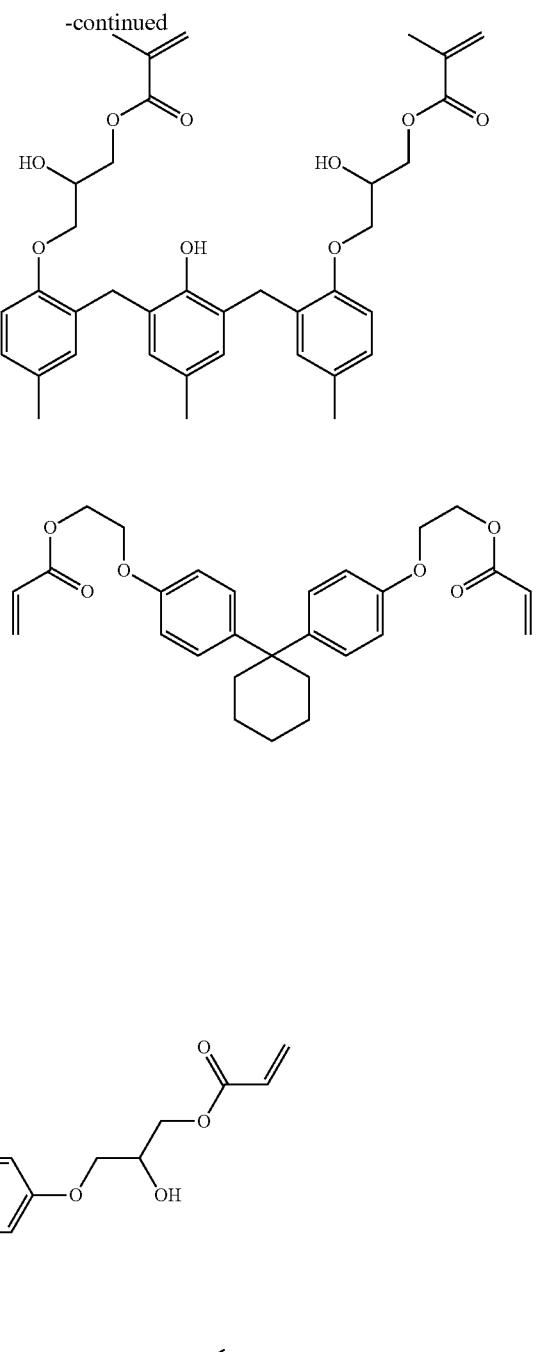
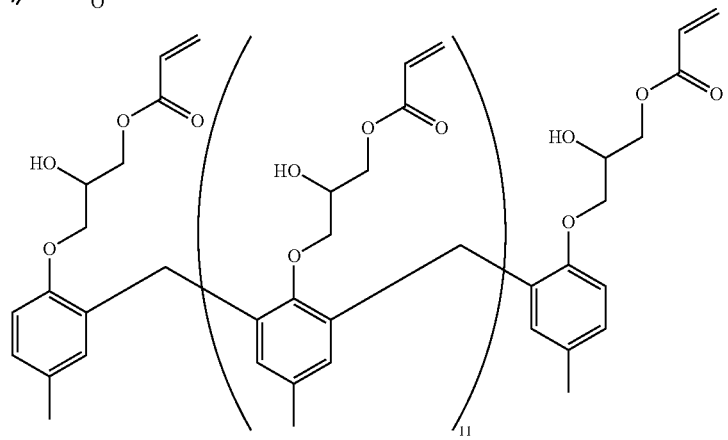

-continued
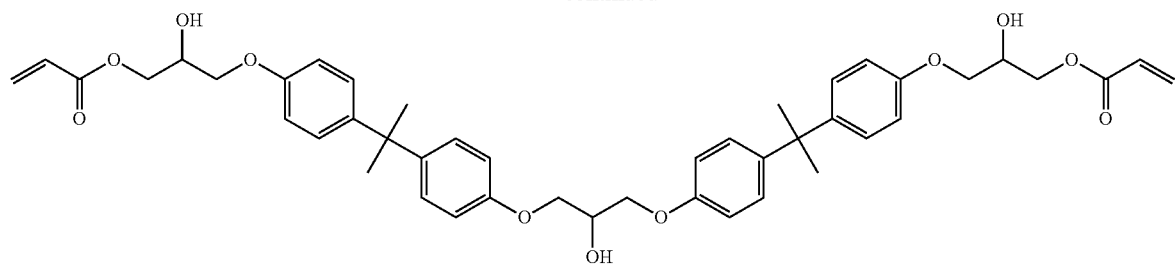
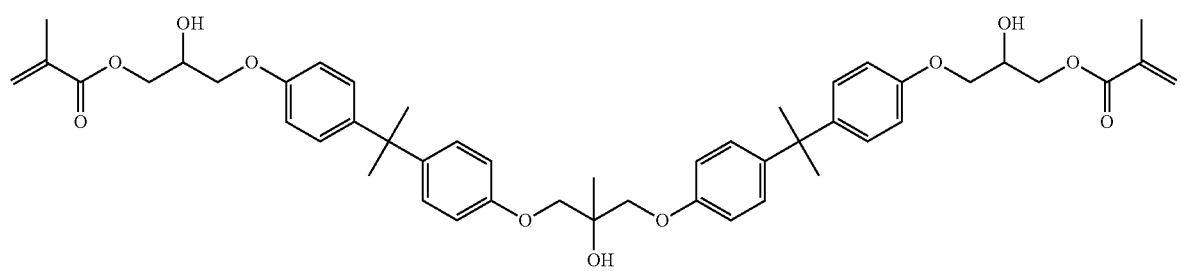
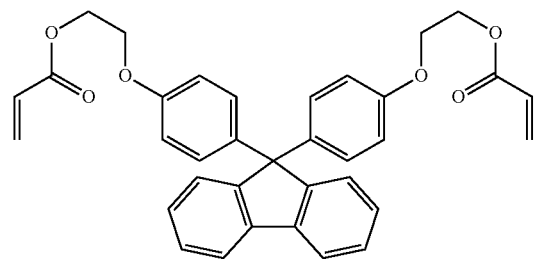
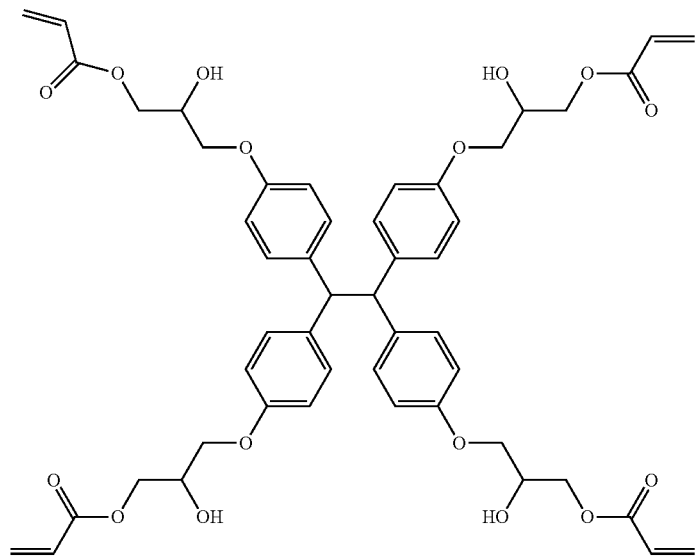

-continued
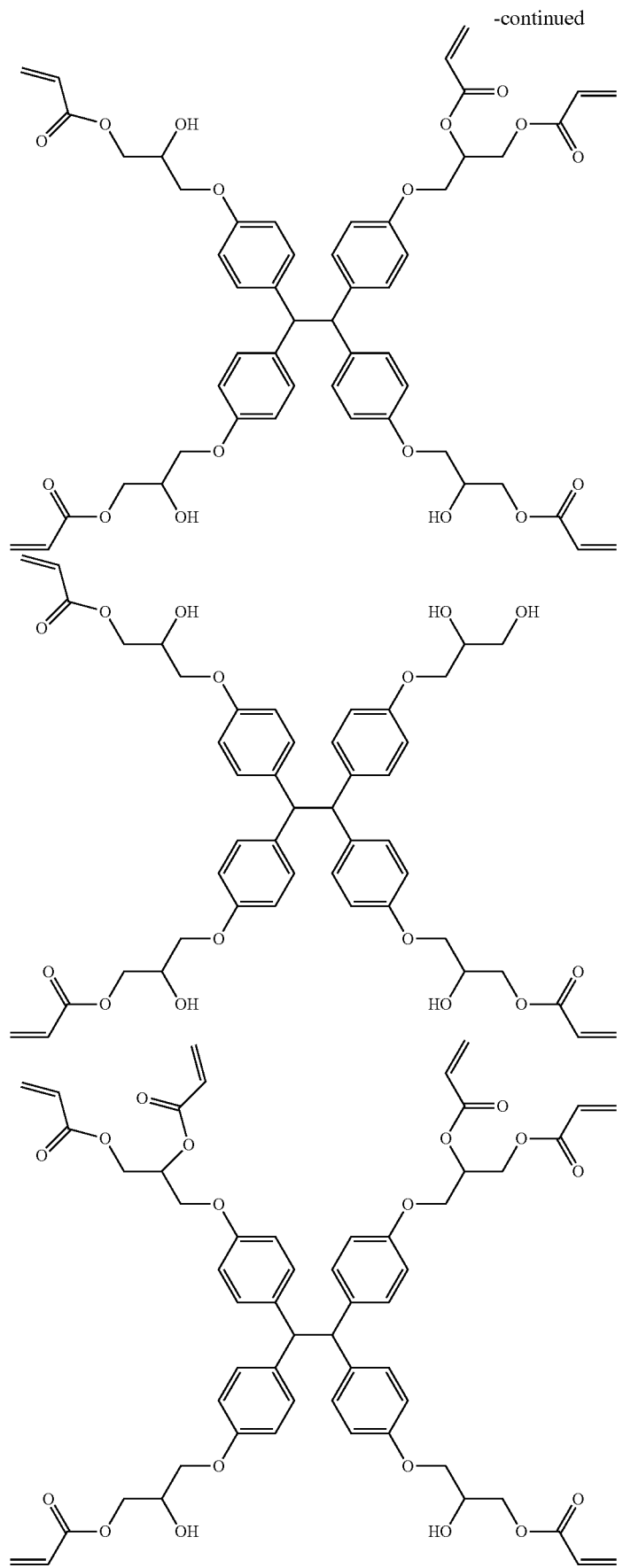

-continued
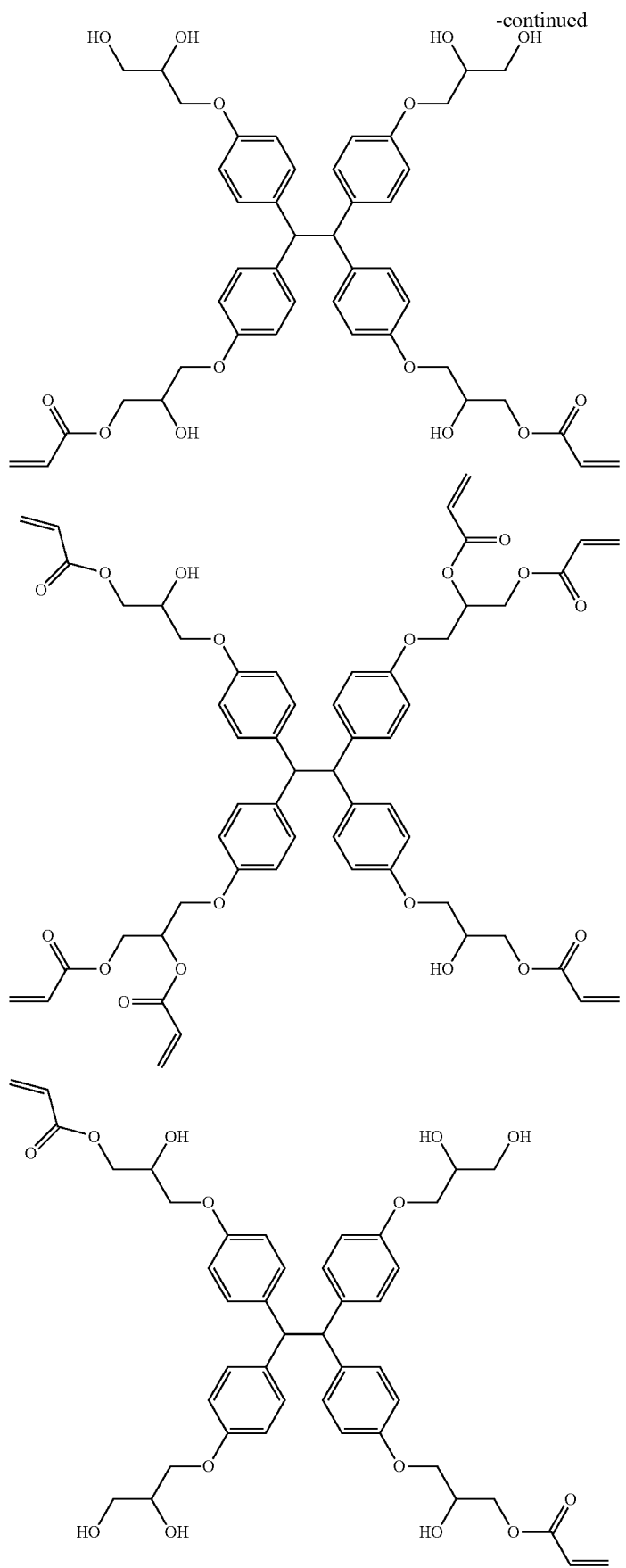

-continued
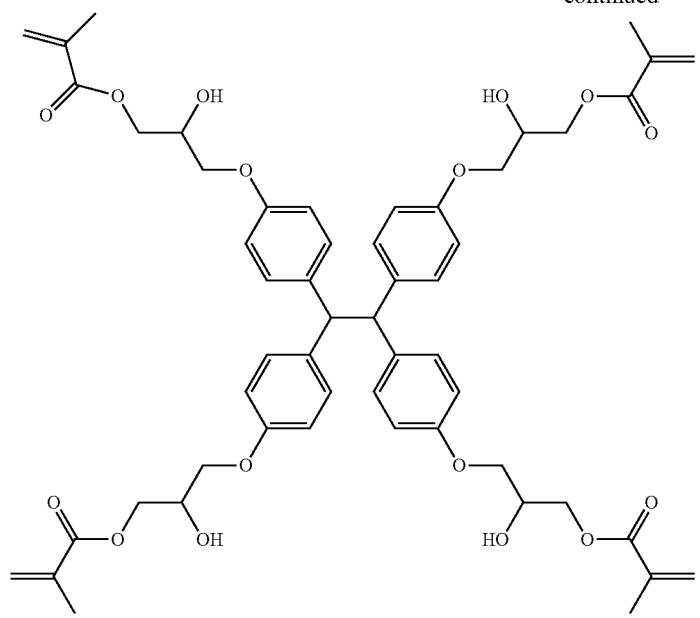
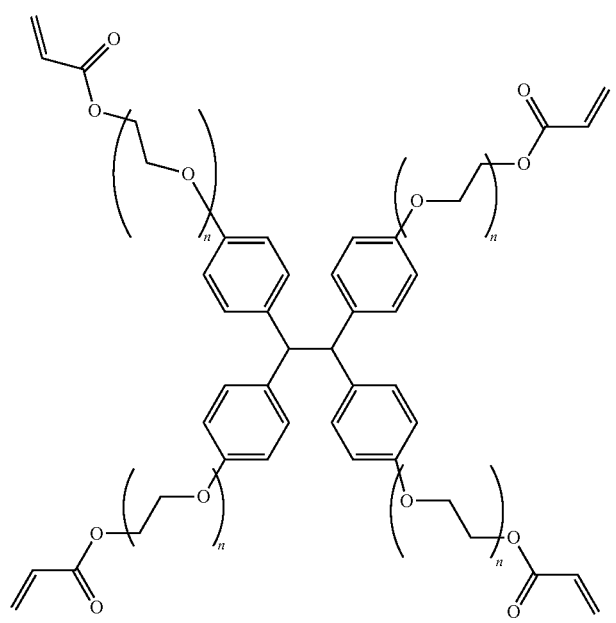
n = 1, 2, 3, 4, or 5

-continued
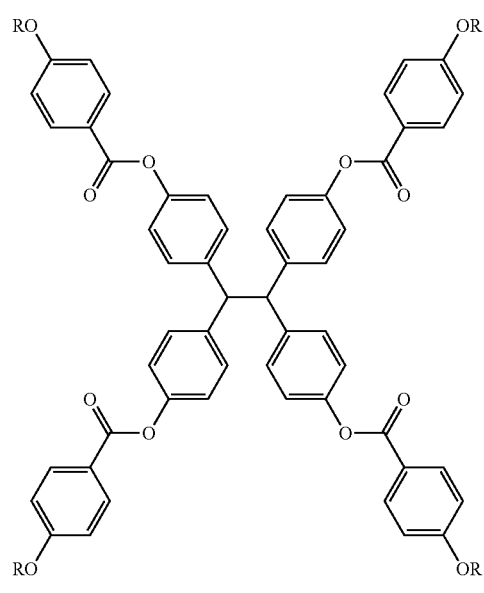
R = —(CH₂)$_n$—OCOCH=CH₂
n = 1, 2, 3, 4, or 5
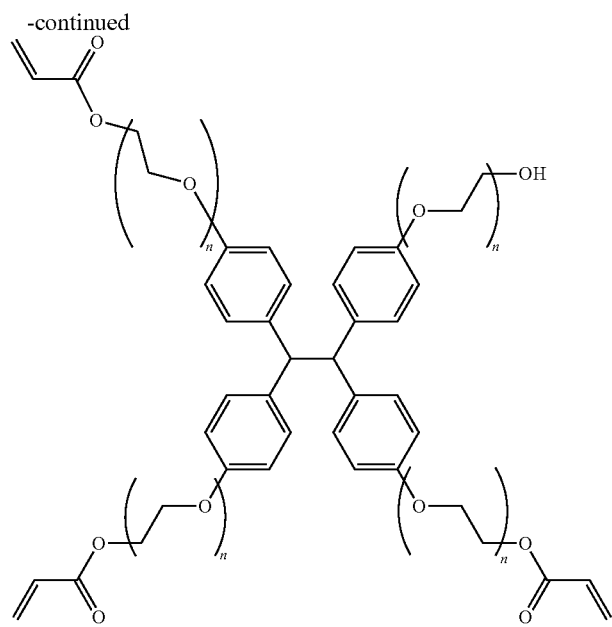
n = 1, 2, 3, 4, or 5
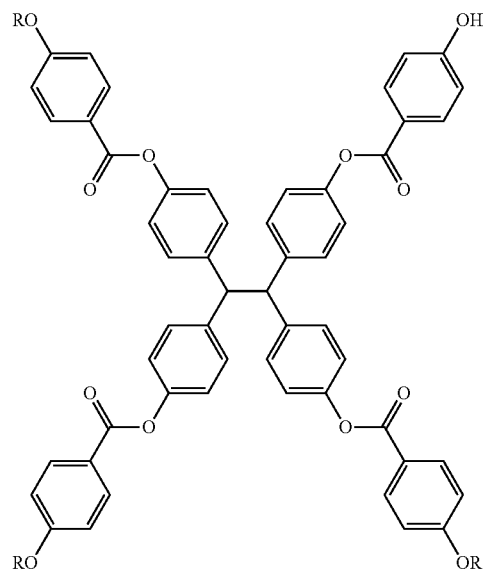
R = —(CH₂)$_n$—OCOCH=CH₂
n = 1, 2, 3, 4, or 5
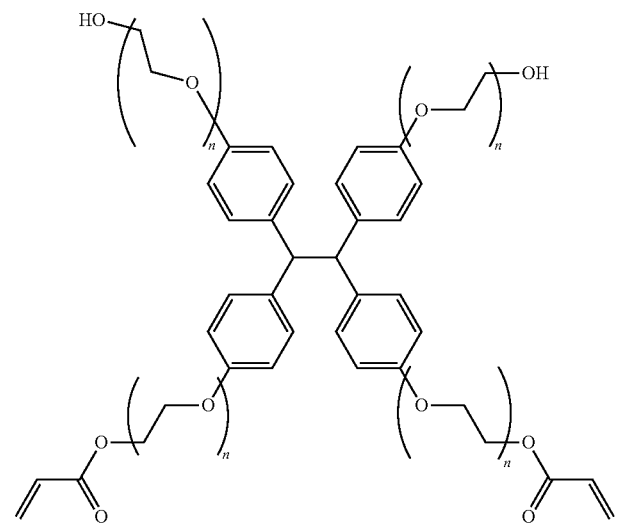
n = 1, 2, 3, 4, or 5

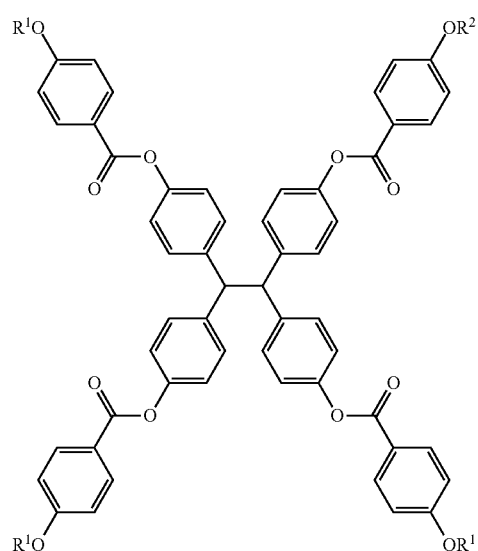
R¹ = —(CH$_2$)$_n$—OCOCH=CH$_2$
R² = —(CH$_2$)$_n$OH
n = 1, 2, 3, 4, or 5
-continued
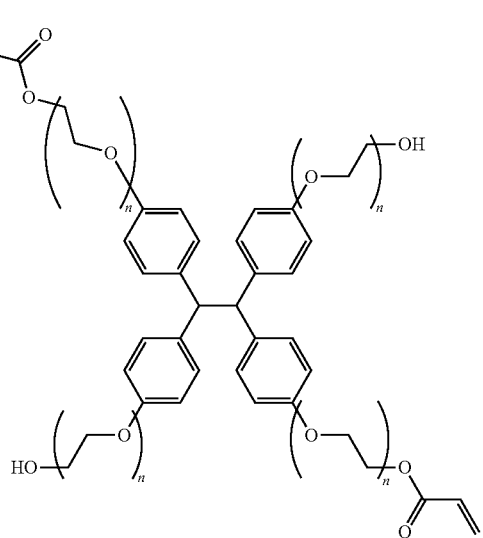
n = 1, 2, 3, 4, or 5
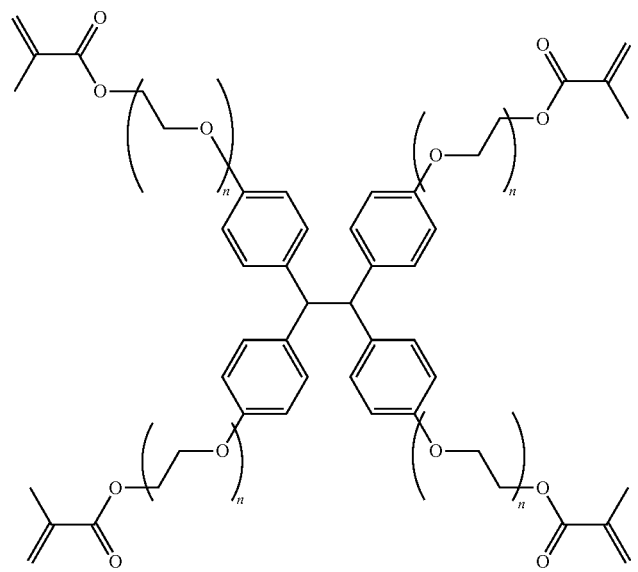
n = 1, 2, 3, 4, or 5

-continued
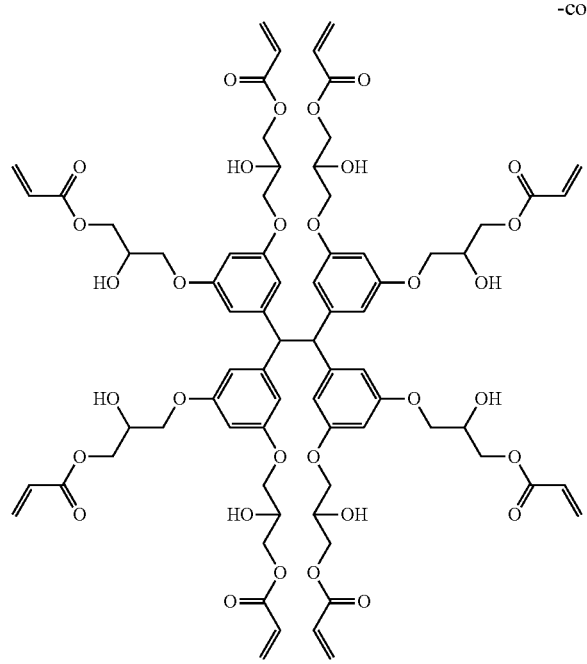
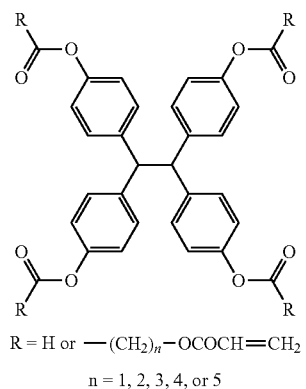
R = H or —(CH$_2$)$_n$—OCOCH=CH$_2$
n = 1, 2, 3, 4, or 5
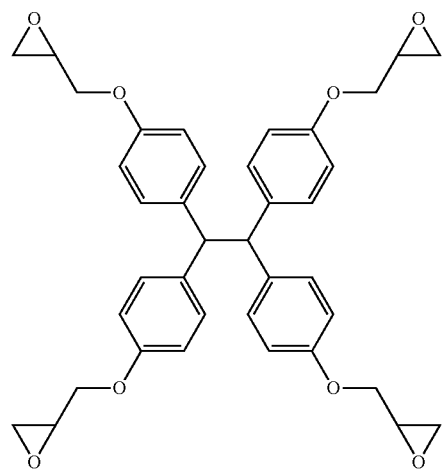
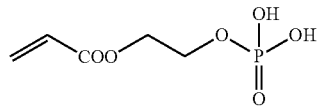
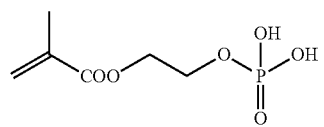
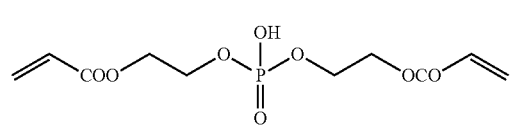
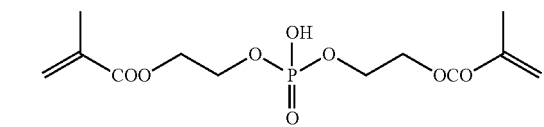
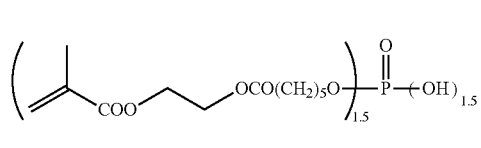
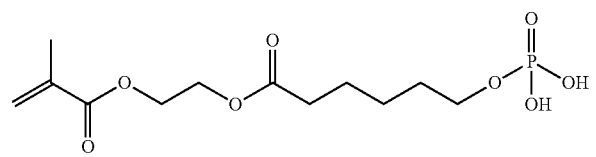
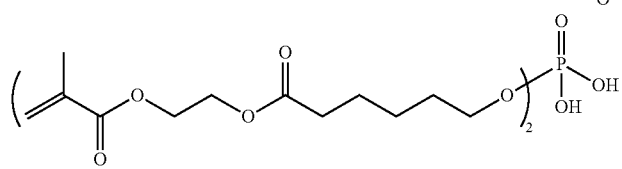

(Silane Coupling Agent)

From the viewpoint of adding wet heat durability to the barrier laminate, a silane coupling agent may preferably be added to the organic layer adjacent to the inorganic barrier layer. In particular, when the inorganic barrier layer contains a silicon oxide, a silicon nitride, a silicon carbide or a mixture thereof, and the organic layer is formed immediately above the inorganic barrier layer, the effect thereof is effectively achieved. It is presumed that this is because the adhesion to the inorganic barrier layer is strengthened.

The silane coupling agent is formed of an organosilicon compound having, in one molecule, both a hydrolyzable group that reacts with an inorganic substance and an organic functional group that reacts with an organic substance. Examples of the hydrolyzable groups that react with an inorganic substance include alkoxy groups such as methoxy group and ethoxy group, acetoxy group and chloro group. Examples of the organic functional groups that react with an organic substance include a (meth)acryloyl group, epoxy group, vinyl group, isocyanate group, amino group and mercapto group, and the silane coupling agent having a (meth)acryloyl group is preferably used.

The silane coupling agent may have an alkyl group or phenyl group which reacts with neither an inorganic substance nor an organic substance. Furthermore, the silane coupling agent can be mixed with a silicon compound having no organic functional groups, for example, a compound such as an alkoxysilane having only a hydrolyzable group. The silane coupling agent may be contained in the polymerizable composition as one type or a mixture of two or more types.

Examples of the silane coupling agents preferably used include 3-acryloxypropyl trimethoxysilane, 3-methacryloxypropyl methyl dimethoxysilane, 3-methacryloxypropyl triethoxysilane, 2-(3,4-epoxycyclohexyl)ethyl trimethoxysilane, 3-isocyanatopropyl triethoxysilane, 3-isocyanatopropyl trimethoxysilane, N-(2-aminoethyl)-3-aminopropyl methyl dimethoxysilane, N-(2-aminoethyl)-3-aminopropyl trimethoxysilane, 3-aminopropyl trimethoxysilane, 3-mercaptopropyl methyl dimethoxysilane, and the like.

The proportion of the silane coupling agent in the solid content (the remainder after volatilization of the volatile content) of the polymerizable composition is preferably 1 to 30 mass %, and is more preferably 5 to 20 mass %.

(Polymerization Initiator)

The organic layer can generally be obtained by curing a polymerizable composition. Preferably, for example, the polymerizable composition may be polymerized and cross-linked by irradiation of the polymerizable composition with energy rays such as heat or ultraviolet ray, to form an organic layer having a polymer as a main component. Examples of the energy rays include ultraviolet rays, visible rays, infrared rays, electron rays, X-rays, gamma rays, and the like. At this time, when polymerization is performed by heat, a thermal polymerization initiator is used, when polymerization is performed by ultraviolet rays, a photopolymerization initiator is used and when polymerization is performed by visible rays, a photopolymerization initiator and a sensitizer are used. Preferably, the organic layer is formed by polymerization and cross-linking of a polymerizable compound by irradiation with ultraviolet rays after the application of a polymerizable composition containing a photopolymerization initiator.

When a photopolymerization initiator is used, the content thereof is preferably 0.1 mole %, more preferably 0.5 to 2 mole % of the total amount of the polymerizable compounds. By adoption of such a composition, a polymerization reaction via an active component generation reaction can be appropriately controled.

As a polymerization initiator used for the polymerizable composition containing the polymerizable compound represented by the above-described general formula (1), a polymerization initiator that can be dissolved in lower alcohol or water is preferably used, and specific examples thereof include Irgacure2959, Irgacure819, Irgacure127 and DarocureTPO, which are commercially available from Ciba Specialty Chemicals Inc., and the like.

A number of polymerization initiators commercially available can be used for the other polymerizable compositions, depending on the type of organic solvent of the polymerizable composition, and specific examples thereof include Irgacure series (for example, Irgacure651, Irgacure754, Irgacure184, Irgacure2959, Irgacure907, Irgacure369, Irgacure379 and Irgacure819), Darocure series (for example, DarocureTPO and Darocure1173) and QuantacurePDO manufactured by Ciba Specialty Chemicals Inc., Ezacure series (for example, EzacureTZM and EzacureTZT) commercially available from Sartomer Ltd., and the like.

(Solvent)

A polymerizable composition generally includes a solvent. Examples of the solvents generally include ketone and ester solvents, 2-butanone, propyleneglycol monoethyl ether acetate and cyclohexanone. However, an alkyl alcohol having 1 to 3 carbon atoms, water or a mixture thereof is preferably used, and an alkyl alcohol having 1 to 3 carbon atoms or a mixture of water and an alkyl alcohol having 1 to 3 carbon atoms is more preferably used, in the polymerizable composition containing the polymerizable compound represented by the above-described general formula (1). Specific examples of the alkyl alcohols each having 1 to 3 carbon atoms include methanol, ethanol, n-propyl alcohol and isopropyl alcohol, and methanol is preferable.

In the polymerizable composition containing the polymerizable compound represented by general formula (1), the solvent may be selected in consideration of the explosion-proof performance of an application step, the processing capacity of the volatilized organic solvent, the drying capacity or the water solubility of the polymerization initiator used together with the polymerizable compound. For example, when a polymerization initiator low in water solubility but high in the solubility in lower alcohol is used in order to acquire the wet heat stability of a gas barrier film over time or when application is required to be performed using a coater which has a low drying capacity in a drying zone after the application, lower alcohol may be used as the solvent. On the other hand, when a coater insufficient in the explosion-proof performance or the volatile organic solvent processing performance is used, water or a solvent mixture of alcohol and water may be used.

The content of the solvent is preferably 60 to 97 mass % of the polymerizable composition and is more preferably 70 to 95 mass %.

(Step of Polymerizing and Curing Organic Layer)

After the provision of a thin film of the polymerizable composition, the organic layer is preferably formed by being polymerized through irradiation with energy rays. Examples of solution application methods include a dip coating method, an air knife coating method, a curtain coating method, a roller coating method, a wire bar coating method, a gravure coating method, a slide coating method or an extrusion coating method using a hopper described in U.S. Pat. No. 2,681,294. Examples of vacuum film formation methods include a flash vapor deposition method.

Examples of the polymerization methods include a light irradiation method, an electron beam irradiation method or the like, and the light irradiation method is preferable. Among the light irradiation methods, an ultraviolet irradiation method is particularly preferable. In the ultraviolet irradiation method, irradiation with ultraviolet rays by a high-pressure mercury lamp or a low-pressure mercury lamp is generally performed. Application energy is preferably 0.2 J/cm$^2$ or more, and is more preferably 0.6 J/cm$^2$ or more. Since the curing reaction of the polymerizable composition receives polymerization inhibition by oxygen in the air, the concentration of oxygen or the partial pressure of oxygen at the time of polymerization is preferably lowered. When the concentration of oxygen at the time of polymerization is lowered by a nitrogen replacement method, the concentration of oxygen is preferably 2% or less, and is more preferably 0.5% or less. When the partial pressure of oxygen at the time of polymerization is lowered by a pressure reduction method, the total pressure is preferably 1000 Pa or less, and is more preferably 100 Pa or less. Furthermore, ultraviolet polymerization is particularly preferably performed by irradiation with energy of 1 J/cm$^2$ or more under a reduced pressure condition of 100 Pa or less.

(Preferred Aspect of Organic Layer)

Preferably, the organic layer is smooth and has high film hardness. No foreign substances such as particles and no protrusions are required on the surface of the organic layer. Therefore, film formation on the organic layer is preferably performed within a clean room. The cleanliness thereof is preferably class 10000 or less, and is more preferably class 1000 or less. With respect to the smoothness of the organic layer, the average roughness (Ra value) of 1 μm square is preferably less than 10 nm, and is more preferably less than 0.52 nm. A rate of polymerization of the polymerizable compound is preferably 85% or more, more preferably 88% or more, further preferably 90% or more, and particularly preferably 92% or more. The rate of polymerization here means a proportion of polymerizable groups undergoing the reaction in all the polymerizable groups in the mixture of the polymerizable compound. The rate of polymerization can be quantified by an Infrared absorption method.

Although the film thickness of the organic layer is not particularly limited, it is difficult to obtain the uniformity of the film thickness when the thickness is excessively large, whereas generation of a crack by an external force lowers the barrier property when the thickness is excessively small. From the viewpoint of what has been described above, the thickness of the organic layer is preferably 50 to 5000 nm, and more preferably 500 to 2500 nm.

It has been found that the more smoothly the inorganic barrier layer is formed, the higher the hardness of the organic layer becomes and thus the barrier property is resultantly enhanced. On the other hand, from the viewpoint of flexibility and adhesion to the adjacent layer, a soft organic layer is advantageous. The range of the hardness in which these properties are secured with good balance is preferably 100 to 350 N/mm, and more preferably 140 to 300 N/mm, when the range is expressed in micro-hardness based on a nano-indentation method.

(Inorganic Barrier Layer)

The inorganic barrier layer is generally a layer of a thin film that is formed of a metal compound. The refractive index of the inorganic barrier layer is preferably 1.60 or more, and more preferably 1.8 to 2. Any method can be used as the method of forming the inorganic barrier layer, as long as the method enables a formation of an intended thin film. Examples thereof include physical vapor deposition methods (PVD) such as a vapor deposition method, a sputtering method and an ion plating method, various chemical vapor deposition methods (CVD) and liquid-phase growth methods such as plating and a sol-gel method. In particular, the CVD method and the sputtering method are preferable in that an inorganic barrier layer that is fine and is excellent in the barrier property can be formed. The composition of the inorganic barrier layer of the present invention is preferably an oxide, a nitride or a carbide containing silicon and/or aluminum or a mixture thereof, and is more preferably a nitride or an oxide of silicon or a mixture thereof. Carbon and/or hydrogen may be contained in a nitride or an oxide of silicon or a mixture thereof. Furthermore, although another metal oxide, metal nitride or metal carbide can be used together, 98 mass % of the total mass of the inorganic barrier layer preferably corresponds to a silicon compound.

As another metal oxide, for example, an oxide, a nitride, a carbide, an oxide nitride, an oxide nitride carbide or the like containing one or more types of metals selected from Al, In, Sn, Zn, Ti, Cu, Ce, Ta and the like can be used together. Among them, an oxide, a nitride or an oxide nitride of a metal selected from Al, In, Sn, Zn and Ti is preferable, and an oxide, a nitride, or an oxide nitride of Al is particularly preferable. As to the smoothness of the inorganic barrier layer formed in the present invention, the average roughness (Ra value) of 1 μm square is preferably less than 1 nm, and is more preferably 0.5 nm or less. Therefore, film formation of the inorganic barrier layer is preferably performed within a clean room. The cleanliness thereof is preferably class 10000 or less, and is more preferably class 1000 or less.

As to the thickness of the inorganic barrier layer, the thickness of one layer thereof is preferably 15 to 100 nm, and is more preferably 20 to 50 nm. From the view point of enhancement of the barrier property, qualitatively, the larger the thickness of the inorganic barrier layer is, the more advantageous it is, but the productivity of the process of forming the inorganic barrier layer tends to be degraded in substantially inversely proportional to the thickness of the inorganic barrier layer. Since the productivity of the process of manufacturing the inorganic barrier layer is a rate-determining factor for the production cost of the barrier film, an increase in the thickness of the inorganic barrier layer directly causes a cost increase. Furthermore, in the barrier film having the thickness of the inorganic barrier layer exceeding 100 nm, risk of causing a fault in the shape of a crack in the inorganic barrier layer, when the barrier film is bent, tends to significantly increase. On the other hand, when the inorganic barrier layer is thinner than the above described thickness, the probability of the occurrence of a pinhole at the time of forming the inorganic barrier layer significantly increases, with the result that the barrier property tends to be significantly degraded.

(Functional Layer)

In the gas barrier film of the present invention, a functional layer may be included on the barrier laminate or in another position. The functional layer is described in detail in paragraphs 0036 to 0038 of Japanese Patent Application Laid-Open No. 2006-289627. Examples of the functional layers other than these functional layers include a matting agent layer, a protective layer, an antistatic layer, a flattening layer, an adhesiveness-improving layer, a light-shielding layer, an antireflection layer, a hard coat layer, a stress-relaxing layer, an antifogging layer, an antifouling layer, a layer to be printed, an easily adhesive layer, and the like.

(Gas Barrier Film)

The gas barrier film may include a support and the barrier laminate. Preferably, the barrier laminate may be directly provided on the support.

In the gas barrier film, the barrier laminate may be provided on one side of the support or may be provided on both sides. As to the lamination order of the layers, the inorganic layer and the organic layer may be laminated in this order from the side of the support or the organic layer and the inorganic layer may be laminated in this order. When a support low in durability under an environment of the process of forming the inorganic layer is used or when it is predicted that a sufficient optical transmittance cannot be obtained due to a large difference in the refractive index between the support and the inorganic layer, an embodiment in which the layers are laminated after the organic layer is first imparted on the support is preferable. On the other hand, when it is difficult to secure the adhesion between the support and the organic layer, an embodiment in which the layers are laminated after the inorganic layer is first laminated on the support is preferable in many cases.

When the barrier laminate includes a plurality of organic layers, the organic layer formed of the polymerizable composition containing the polymerizable compound represented by general formula (1) is preferably used as an organic layer close as possible to the support. For example, preferably, the organic layer formed of the polymerizable composition containing the polymerizable compound represented by general formula (1) is adjacent to the support or is adjacent to the inorganic barrier layer adjacent to the support. When the organic layer is provided on both sides of the support, on each of the front and back sides, application to the organic layer close as possible to the support is preferable. Therefore, when a plurality of organic layers is present in the gas barrier film, only the organic layer closest to the support may be the organic layer formed of the polymerizable composition containing the polymerizable compound represented by general formula (1).

The gas barrier film may include constituent components (for example, a functional layer such as an easily adhesive layer) other than the barrier laminate and the support. The functional layer may be arranged at any position such as on the barrier laminate, between the barrier laminate and the support, or on the side (back side) on the support where the barrier laminate is not arranged.

(Support)

The support is preferably a plastic film. A material, film thickness and the like of the plastic film are not particularly limited as long as the plastic film can hold the barrier laminate, and the plastic film can be appropriately selected depending on the intended use or the like. According to the type of organic electronic device, a transparent plastic film or a film having high optical characteristics may be preferable. Specific examples of the plastic films include thermoplastic resins such as a polyester resin, a methacrylic resin, a methacrylic acid-maleic acid copolymer, a polystyrene resin, a transparent fluororesin, a polyimide, a fluorinated polyimide resin, a polyamide resin, a polyamideimide resin, a polyetherimide resin, a cellulose acylate resin, a polyurethane resin, a polyether ether ketone resin, a polycarbonate resin, an alicyclic polyolefin resin, a polyarylate resin, a polyethersulfone resin, a polysulfone resin, a cycloolefin polymer, a cycloolefin copolymer, a fluorene ring-modified polycarbonate resin, an alicyclic-modified polycarbonate resin, a fluorene ring-modified polyester resin and an acryloyl compound. A polyester resin or a so-called optical film is preferable as the plastic film; polyethylene terephthalate (PET) or polyethylene naphthalate (PEN) is more preferable as the polyester resin, and a cycloolefin polymer, a cycloolefin copolymer or a polycarbonate resin is more preferable as the optical film.

The thickness of the support is not particularly limited, and a support having a thickness in the range of 1 to 800 μm, 10 to 400 μm, 20 to 200 μm or 40 to 100 μm may be used.

Examples of the particularly preferable supports include a support that contains a polymer (such as a cycloolefin polymer or a cycloolefin copolymer) containing a cyclic olefin within a repeating unit and a polycarbonate resin (such as a fluorene ring-modified polycarbonate resin or an alicyclic-modified polycarbonate resin).

As the resin film consisting of a polymer or a copolymer containing a cyclic olefin within a repeating unit, a structure in which only the repeating units of a cyclic olefin structure are coupled by an ethylene chain or a structure in which in addition to a cyclic olefin structure, ethylene or an derivative thereof is used as one of the repeating units can be preferably used. Specific examples of the commercially available products include ARTON manufactured by JSR Corpration., ZEONOR manufactured by Nippon Zeon Corporation, TOPAS manufactured by Polyplastics Co., Ltd. and APEL manufactured by Mitsui Chemicals Tohcello Inc. On the other hand, the polycarbonate resin is a resin having a structure in which bisphenol is coupled by a carbonate group. Specific examples of the film that can be used as the support containing the polycarbonate include R140 manufactured by Kaneka Corporation and Pure Ace manufactured by Teijin Kasei Co., Ltd.

In the gas barrier film of the present invention, the atmosphere on the supply side of water vapor is a conditions of 40° C. and a relative humidity of 90%, and in the case of a configuration of the organic layer/the inorganic barrier layer/the organic layer, the water vapor transmission rate can be set to approximately $1\times10^{-4}$ g/m$^2$/day, and furthermore, in the case of a configuration of the inorganic barrier layer/the organic layer/the inorganic barrier layer/the organic layer, the average water vapor transmission rate can be set to approximately $5\times10^{-5}$ g/m$^2$/day.

<Device>

In recent years, in the field of organic devices for image display (such as an organic EL device and an organic TFT device), needs for a transparent gas barrier film have been grown as a substitute for a thin-plate glass of moisture-proof sealing. However, the development of a transparent gas-barrier film having a low-retardation property (low birefringence) or a retardation adjustment function and a high barrier performance at the same time is in a situation of not advancing. Namely, this is because although in order for the barrier film to have a low-retardation property or a retardation adjustment function, the support needs to have a low-retardation property, there exists a problem of lowering or the like of its transparency when the organic layer is produced thereon, in the support having a low-retardation property. A support that contains a polymer containing a cyclic olefin within a repeating unit or a support that contains a polycarbonate resin has an excellent low-retardation property or a retardation adjustment property, and even when the support is combined with the barrier laminate of the present invention, the problem described above is unlikely to occur, with the result that it is possible to produce a gas barrier film suitably applicable to an organic device for image display.

The barrier laminate and the gas barrier film of the present invention are used preferably for devices in which the performance tends to be deteriorated by a chemical component in the air (such as oxygen, water, nitrogen oxide, sulfur oxide or ozone). Examples of the devices include electronic devices such as an organic EL element, a liquid crystal display element, a thin film transistor, a touch panel, electronic paper and a solar cell, and the gas barrier film can be used preferably for an organic EL element.

The gas barrier film of the present invention can be used for the sealing of a device for image display or in a flexible substrate, and can be particularly preferably used for the sealing of an organic EL device or an organic TFT device or in a flexible substrate. One form of the sealing includes a solid sealing method, and the embodiment is a method of forming a protective layer on a device, and then overlapping and curing an adhesive layer and a gas barrier film. The adhesive is not particularly limited, and examples thereof include a thermosetting epoxy resin, a photo-curable acrylate resin, and the like.

An example of the organic EL element using the gas barrier film is described in detail in Japanese Unexamined Patent Application Publication No. 2007-30387. In an organic TFT device, a gas barrier film that also has a function of a λ/4 plate can be incorporated into the device.

EXAMPLES

Hereinafter, the present invention will be described more specifically through Example. Materials, amounts used, percentages, treatment contents, treatment procedures and the like shown in Example below can be changed appropriately as long as they do not depart from the gist of the present invention. Accordingly, the scope of the present invention is not limited to specific examples shown below.

Example 1

[Preparation of Gas Barrier Films Having Structure of Support/Organic Layer/Inorganic Barrier Layer/Organic Layer]

The gas barrier films of 1-1 to 1-19 having a laminated structure of the support/the organic layer/the inorganic barrier layer/the organic layer were prepared by changing a support, a polymerizable compound that is a precursor of a first organic layer, the type of the application solvent of a precursor composition and a polymerization initiator as shown in Table 1. The barrier performance, the flexibility and the interlayer adhesion of the prepared gas barrier films were evaluated.

Table 1

| | Support | | First organic polymer layer | | | |
|---|---|---|---|---|---|---|
| Sample No. | Support name | Moisture content (%) | Polymerizable compound | Polymerization initiator | Application solvent | Remarks |
| 1-1 | ZEONOR | <0.01 | SR494 97 wt % | DarocureTPO 3 wt % | 2-butanone | Comparative example |
| 1-2 | " | " | PET-30 97 wt % | " | " | Comparative example |
| 1-3 | " | " | FF-214 59 wt % PET-30 38 wt % | " | methanol | Present invention |
| 1-4 | " | " | FF-214 97 wt % | " | " | Present invention |
| 1-5 | TOPAS | 0.02 | SR494 97 wt % | " | 2-butanone | Comparative example |
| 1-6 | " | " | PET-30 97 wt % | " | " | Comparative example |
| 1-7 | " | " | FF-214 59 wt % PET-30 38 wt % | " | methanol | Present invention |
| 1-8 | " | " | FF-214 97 wt % | " | " | Present invention |
| 1-9 | ARTON | 0.4 | SR494 97 wt % | " | 2-butanone | Comparative example |
| 1-10 | " | " | PET-30 97 wt % | " | " | Comparative example |
| 1-11 | " | " | FF-214 59 wt % PET-30 38 wt % | " | methanol | Present invention |
| 1-12 | " | " | FF-214 97 wt % | " | " | Present invention |
| 1-13 | " | " | FF-214 97 wt % | Irgacure2959 | methanol/water = 5/5 | Present invention |
| 1-14 | " | " | " | " | methanol/water = 1/9 | Present invention |
| 1-15 | R140 | 0.2 | SR494 97 wt % | " | 2-butanone | Comparative example |
| 1-16 | " | " | PET-30 97 wt % | " | " | Comparative example |
| 1-17 | " | " | FF-214 59 wt % PET-30 38 wt % | " | methanol | Present invention |
| 1-18 | " | " | FF-214 97 wt % | " | " | Present invention |
| 1-19 | " | " | FF-214 97 wt % | Irgacure2959 | methanol/water = 5/5 | Present invention |

The thickness, the resin composition and the water absorption rate of the support in table 1 are as follows.
  ARTON: thickness of 70 μm, resin composition—cyclic olefin polymer, water absorption rate—0.4%
  ZEONOR: thickness of 100 μm, resin composition—cyclic olefin polymer, water absorption rate—<0.01%
  TOPAS: thickness of 100 μm, resin composition—cyclic olefin polymer, water absorption rate—0.02%
  R140: thickness of 100 μm, resin composition—polycarbonate, water absorption rate—0.2%
The manufacturers and the chemical structures of the polymerizable compounds in Table 1 are as follows.
  FF-214: it was synthesized by a method described in the synthesis of the exemplified compound (1a) disclosed in Example of Japanese Unexamined Patent Application Publication No. 2012-206992.

Structural Formula

General formula (1)

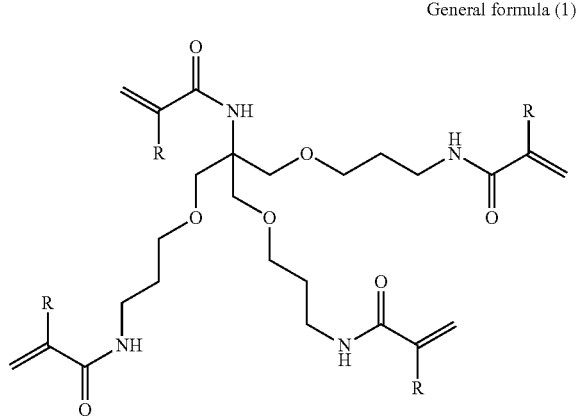

In the formula, all Rs are hydrogen atoms.
PET-30: manufactured by Nippon Kayaku Co., Ltd.

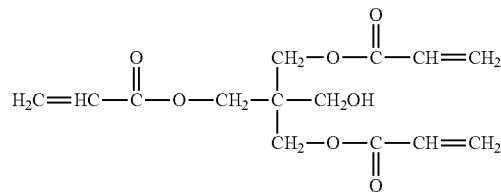 [SMILES: C=CC(=O)OCC(CO)(COC(=O)C=C)COC(=O)C=C]

SR494: manufactured by Kayaku Sartomer Co., Ltd.

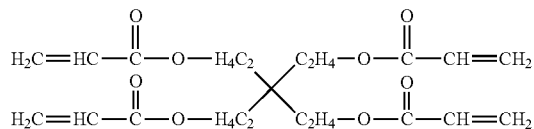

(Formation of the First Organic Layer)

The precursor composition was prepared by setting the solid proportion of the polymerizable compound to 97 mass % and the solid proportion of the polymerization initiator to 3 mass %, and dissolving each of the polymerizable compound and the polymerization initiator in the solvent shown in Table 1. The precursor composition was applied, by a spin coat method, onto the support subjected to a surface treatment with an atmospheric-pressure plasma in an air atmosphere, and then, the resultant applied material was dried at room temperature for 4 minutes. Subsequently, in an atmosphere of nitrogen having an oxygen content of 100 ppm or less, and at a temperature of 80° C., irradiation with ultraviolet rays having a main wavelength of 365 nm was performed at an irradiation amount of 0.6 J/cm² to thereby cure the resultant material by photopolymerization, with the result that an organic layer was produced.

Adequate adjustments of the solid concentration within a range of 15 to 35 mass % and the number of rotations of the spin coating within a range of 500 to 2000 rpm were made such that the film thickness after the polymerization and curing was 2 μm.

(Formation of Inorganic Barrier Layer)

Through the use of a plasma CVD method using ammonia, silane and hydrogen as raw material gases, a film of silicon nitride (refractive index of 1.95) having a thickness of 35 nm was formed on the surface of the organic layer prepared as described above. 1 atm % of carbon and 25 atm % of hydrogen were contained in the film of silicon nitride.

(Formation of the Second Organic Layer)

In the solid proportion, 73 mass % of 3-functional acrylate monomer: Aronix M-308 (manufactured by Toa Gosei Co., Ltd.), 20 mass % of silane coupling agent: KBM-5103 (manufactured by Shin-Etsu Chemical Co., Ltd.), 5 mass % of phosphoric acid group-containing 1-functional acrylate monomer: PM-21 (manufactured by Nippon Kayaku Co., Ltd.) and 2 mass % of polymerization initiator: DarocureTPO (manufactured by Ciba Specialty Chemicals Inc.) were dissolved in 2-butanone solvent at a solid concentration of 22 mass %, and thus the polymerizable composition was prepared. Spin-coating was performed by adequate adjustments of the number of rotations of the spin coating within a range of 800 to 1600 rpm such that the film thickness after the film formation was 1 μm, and then, the resultant material was dried at room temperature for 4 minutes. Subsequently, in an atmosphere of nitrogen having an oxygen content of 100 ppm or less, and at a temperature of 80° C., irradiation with ultraviolet rays having a main wavelength of 365 nm was performed at an irradiation amount of 0.6 J/cm² to thereby cure the resultant material by photopolymerization, with the result that an organic layer was produced.

(Performance Evaluation of Gas Barrier Film)

The barrier performance (water vapor transmission rate), the flexibility and the interlayer adhesion after wet heat aging were evaluated for the obtained gas barrier films, by the following method.

[Barrier Performance Evaluation]

Evaluation was performed in terms of the water vapor transmission rate (g/m²/day) measured using a method described in pages 1435 to 1438 of SID Conference Record of the International Display Research Conference by G. NISATO, P. C. P. BOUTEN, P. J. SLIKKERVEER, et al. The atmosphere on the supply side of water vapor was set to 40° C., and the relative humidity was set to 90%.

[Flexibility Evaluation]

Evaluation was performed using a cylindrical mandrel bending test. A test sample was wound around a mandrel for bending test with the side where the organic layer and the inorganic barrier layer are laminated being directed outward, was folded by 180°, was held for 5 seconds and was then returned to an unfolded state. Whether a crack or a break is generated in the bent portion of the sample thus obtained was observed visually and with an optical microscope having a magnification of 100. The superiority or inferiority of the flexibility was evaluated depending on to what extent the test sample bears the bending test using a mandrel of a smaller diameter, without occurrence of a crack or a break when the diameter of the mandrel was gradually decreased.

The results thereof are shown in Table 2.

TABLE 2

| Sample No. | WVTR(g/m²/day) @40 C. 90% RH | The smallest bend diameter without a crack (mm) @ cylindrical mandrel | Remarks |
|---|---|---|---|
| 1-1 | 3.5 × 10⁻⁴ | 3 | Comparative example |
| 1-2 | 2.5 × 10⁻⁴ | 3 | Comparative example |
| 1-3 | 1.8 × 10⁻⁴ | 2 | Present invention |
| 1-4 | 1.2 × 10⁻⁴ | 2 | Present invention |
| 1-5 | 3.0 × 10⁻⁴ | 8 | Comparative example |

TABLE 2-continued

| Sample No. | WVTR(g/m²/day) @40 C. 90% RH | The smallest bend diameter without a crack (mm) @ cylindrical mandrel | Remarks |
|---|---|---|---|
| 1-6 | 2.0 × 10⁻⁴ | 8 | Comparative example |
| 1-7 | 1.5 × 10⁻⁴ | 6 | Present invention |
| 1-8 | 1.0 × 10⁻⁴ | 6 | Present invention |
| 1-9 | 5.0 × 10⁻⁴ | 16 | Comparative example |
| 1-10 | 4.0 × 10⁻⁴ | 20 | Comparative example |
| 1-11 | 1.5 × 10⁻⁴ | 3 | Present invention |
| 1-12 | 1.0 × 10⁻⁴ | 2 | Present invention |
| 1-13 | 1.0 × 10⁻⁴ | 2 | Present invention |
| 1-14 | 1.2 × 10⁻⁴ | 2 | Present invention |
| 1-15 | 6.0 × 10⁻⁴ | 10 | Comparative example |
| 1-16 | 4.0 × 10⁻⁴ | 16 | Comparative example |
| 1-17 | 1.7 × 10⁻⁴ | 3 | Present invention |
| 1-18 | 1.0 × 10⁻⁴ | 2 | Present invention |
| 1-19 | 1.2 × 10⁻⁴ | 2 | Present invention |

As is clear from the above results, it is found that the gas barrier film containing the organic layer formed of the polymerizable composition containing the polymerizable compound (FF-214) represented by general formula (1) are excellent in barrier performance and flexibility. It is also clear that the polymerizable composition containing the polymerizable compound represented by general formula (1) can be applied not only to a support of a cyclic olefin copolymer satisfying the requirements of a film support disclosed in Japanese Unexamined Patent Application Publication No. 2012-213938 and having a water absorption rate of 0.1% or less, but also to a film of a cyclic olefin polymer having a water absorption rate of 0.4% and a polycarbonate film. Furthermore, for the film of the cyclic olefin polymer having a water absorption rate of 0.4%, when the organic layer in comparative examples is used, the barrier performance and the flexibility were inferior to those for the film of the cyclic olefin copolymer having a water absorption rate of 0.1% or less, but when the organic layer formed of the polymerizable composition containing the polymerizable compound represented by general formula (1) is used, the barrier performance and the flexibility were substantially equal to those for the film of the cyclic olefin copolymer having a water absorption rate of 0.1% or less, with the result that the total of the barrier performance and the flexibility was superior to those for the film of the cyclic olefin copolymer having a water absorption rate of 0.1% or less.

Example 2

[Preparation of Gas Barrier Films Having Structure of Support/Inorganic Barrier Layer/Organic Layer/Inorganic Barrier Layer/Organic Layer]

The gas barrier films of 2-1 to 2-14 having a multilayer structure of the support/the inorganic barrier layer/the organic layer/the inorganic barrier layer/the organic layer were prepared by changing a polymerizable compound, the type of an application solvent of a precursor composition and a polymerization initiator as shown in Table 3, in the preparation of a support and the first and the second organic layers. The barrier performance and the haze of the prepared gas barrier films were evaluated.

TABLE 3

| | Support | | First organic polymer layer | | |
|---|---|---|---|---|---|
| Sample No. | Support name | Moisture content (%) | Polymerizable compound | Polymerization initiator | Application solvent |
| 2-1 | ARTON | 0.4 | SR494 78 wt %<br>KBM-5103 20 wt % | DarocureTPO 3 wt % | 2-butanone |
| 2-2 | " | " | PET-30 78 wt %<br>KBM-5103 20 wt % | " | " |
| 2-3 | " | " | FF-214 59 wt %<br>PET-30 39 wt %<br>KBM-5103 20 wt % | " | methanol |
| 2-4 | " | " | FF-214 78 wt %<br>KBM-5103 20 wt % | " | " |
| 2-5 | " | " | FF-214 78 wt %<br>KBM-5103 20 wt % | " | " |
| 2-6 | " | " | FF-214 78 wt %<br>KBM-5103 20 wt % | Irgacure2959 | methanol/water = 5/5 |
| 2-7 | " | " | FF-214 78 wt %<br>KBM-5103 20 wt % | " | methanol/water = 1/9 |
| 2-8 | " | " | FF-214 78 wt %<br>KBM-5103 20 wt % | " | " |
| 2-9 | R140 | 0.2 | SR494 78 wt %<br>KBM-5103 20 wt % | DarocureTPO 3 wt % | 2-butanone |
| 2-10 | " | " | PET-30 78 wt %<br>KBM-5103 20 wt % | " | " |
| 2-11 | " | " | FF-214 59 wt %<br>PET-30 39 wt %<br>KBM-5103 20 wt % | " | methanol |
| 2-12 | " | " | FF-214 78 wt %<br>KBM-5103 20 wt % | " | " |
| 2-13 | " | " | FF-214 78 wt %<br>KBM-5103 20 wt % | " | " |
| 2-14 | " | " | FF-214 78 wt %<br>KBM-5103 20 wt % | Irgacure2959 | methanol/water = 5/5 |

TABLE 3-continued

| | Second organic polymer layer | | | |
|---|---|---|---|---|
| Sample No. | Polymerizable compound | Polymerization initiator | Application solvent | Remarks |
| 2-1 | PET-30 73 wt %<br>KBM-5103 20 wt %<br>PM-21 5 wt % | DarocureTPO 2 wt % | 2-butanone | Comparative example |
| 2-2 | PET-30 73 wt %<br>KBM-5103 20 wt %<br>PM-21 5 wt % | " | " | Comparative example |
| 2-3 | PET-30 73 wt %<br>KBM-5103 20 wt %<br>PM-21 5 wt % | " | " | Present invention |
| 2-4 | PET-30 73 wt %<br>KBM-5103 20 wt %<br>PM-21 5 wt % | " | " | Present invention |
| 2-5 | FF-214 73 wt %<br>KBM-5103 20 wt %<br>PM-21 5 wt % | " | methanol | Present invention |
| 2-6 | PET-30 73 wt %<br>KBM-5103 20 wt %<br>PM-21 5 wt % | " | 2-butanone | Present invention |
| 2-7 | PET-30 73 wt %<br>KBM-5103 20 wt %<br>PM-21 5 wt % | " | " | Present invention |
| 2-8 | FF-214 73 wt %<br>KBM-5103 20 wt %<br>PM-21 5 wt % | Irgacure2959 2 wt % | methanol/water = 1 | Present invention |
| 2-9 | PET-30 73 wt %<br>KBM-5103 20 wt %<br>PM-21 5 wt % | DarocureTPO 2 wt % | 2-butanone | Comparative example |
| 2-10 | PET-30 73 wt %<br>KBM-5103 20 wt %<br>PM-21 5 wt % | " | " | Comparative example |
| 2-11 | PET-30 73 wt %<br>KBM-5103 20 wt %<br>PM-21 5 wt % | " | " | Present invention |
| 2-12 | PET-30 73 wt %<br>KBM-5103 20 wt %<br>PM-21 5 wt % | " | " | Present invention |
| 2-13 | FF-214 73 wt %<br>KBM-5103 20 wt %<br>PM-21 5 wt % | " | methanol | Present invention |
| 2-14 | PET-30 73 wt %<br>KBM-5103 20 wt %<br>PM-21 5 wt % | " | 2-butanone | Present invention |

The thickness of the support, the resin composition and the water absorption rate in Table 3 are the same as those in Table 1.

The manufacturers and the chemical structures of the respective polymerizable compounds in Table 3 are the same as those in Table 1 in Example 1.

(Formation of the First Inorganic Barrier Layer)

A film of silicon nitride (refractive index of 1.95) having the same thickness (35 nm) was formed under the same conditions as those of the inorganic barrier layer in Example 1.

(Formation of the First Organic Layer)

The polymerizable composition was prepared by setting solid proportion of the polymerizable compound to 98 mass % and the solid proportion of the polymerization initiator to 2 mass %, and dissolving each of the polymerizable compound and the polymerization initiator in the solvent shown in Table 1. Among 98 mass % of the polymerizable compound, 20 mass % was applied to silane coupling agent: KBM-5103, and 78 mass % of the remainder was changed for each sample. The polymerizable composition was applied, by a spin coating method, onto the support obtained by forming the first inorganic barrier layer, and the resultant material was dried at a temperature of 110° C. for 3 minutes. The same condition as that of the first organic layer in Example 1 was used in the curing process with the subsequent ultraviolet ray irradiation, to prepare the organic layer.

Adequate adjustments of the solid concentration within a range of 15 to 35 mass % and the number of rotations of the spin coating within a range of 500 to 2000 rpm were made such that the film thickness after the polymerization and curing was 2 μm.

(Formation of the Second Inorganic Barrier Layer)

A film of silicon nitride (refractive index of 1.95) having the same thickness (35 nm) was formed under the same conditions as those of the first inorganic barrier layer.

(Formation of the Second Organic Layer)

The polymerizable composition was prepared by setting the solid proportion of the polymerizable compound to 98 mass % and the solid proportion of the polymerization initiator to 2 mass %, and dissolving each of the polymerizable compound and the polymerization initiator in the solvent shown in Table 1. In 98 mass % of the polymerizable compound, 20 mass % was applied to silane coupling agent: KBM-5103, and 5 mass % to phosphoric acid group-containing 1-functional acrylate monomer: PM-21, and 73 mass % of the remainder was changed for each sample. The polymerizable composition was applied, by a spin coating method, onto the support obtained by forming the second inorganic barrier layer, and the resultant material was dried at room temperature for 4 minutes. The same condition as that of the first organic layer in Example 1 was used in the curing process with the subsequent ultraviolet ray irradiation, to prepare the organic layer. Adequate adjustments of the solid concentration within a range of 15 to 25 mass % and the number of rotations of the spin coating within a range of 500 to 2000 rpm were made such that the film thickness after the film formation was 1 μm.

[Barrier Performance Evaluation]

Evaluation was performed by the same method as in Example 1.

[Evaluations on Haze and Total Light Transmittance]

Haze to a D65 light source was measured through the use of NDH2000 manufactured by Nippon Denshoku Industries Co. Ltd, in accordance with JIS-K7136 and JIS-K7361. The results thereof are shown in Table 4.

TABLE 4

| Sample No. | WVTR(g/m²/day) @40 C. 90% RH | Haze (%) @D65 light source | Remarks |
| --- | --- | --- | --- |
| 2-1 | $2.5 \times 10^{-4}$ | 1.45 | Comparative example |
| 2-2 | $2.0 \times 10^{-4}$ | 1.43 | Comparative example |
| 2-3 | $7.4 \times 10^{-5}$ | 0.30 | Present invention |
| 2-4 | $4.9 \times 10^{-5}$ | 0.30 | Present invention |
| 2-5 | $4.7 \times 10^{-5}$ | 0.27 | Present invention |
| 2-6 | $5.0 \times 10^{-5}$ | 0.30 | Present invention |
| 2-7 | $5.2 \times 10^{-5}$ | 0.32 | Present invention |
| 2-8 | $5.0 \times 10^{-5}$ | 0.28 | Present invention |
| 2-9 | $2.9 \times 10^{-4}$ | 1.88 | Comparative example |
| 2-10 | $2.0 \times 10^{-4}$ | 1.75 | Comparative example |
| 2-11 | $8.4 \times 10^{-5}$ | 0.63 | Present invention |
| 2-12 | $5.0 \times 10^{-5}$ | 0.59 | Present invention |
| 2-13 | $4.8 \times 10^{-5}$ | 0.60 | Present invention |
| 2-14 | $5.2 \times 10^{-5}$ | 0.61 | Present invention |

As apparent from the results of Table 4, the barrier performance was satisfactory and the haze was low, in the gas barrier film including the organic layer formed of the polymerizable composition containing the monomer represented by general formula (1). In the test samples with haze exceeding 1%, which use the organic layer of comparative examples, minute wrinkles were generated in the vicinity of the interface between the support and the first inorganic layer.

<Evaluation on Organic EL Light-Emitting Element>

In order to evaluate a barrier property, an organic EL element that generates a black spot (dark spot) defect by water vapor or oxygen was produced, and a module obtained by sealing the element with the gas barrier film of Example 2 was evaluated. First, a conductive glass substrate (surface resistivity 10Ω/□ (Ω/sq., ohms per square)) including an ITO film was washed with 2-propanol, and then, UV-ozone processing was performed for 10 minutes. The following compound layers were sequentially deposited on the substrate (positive electrode), by a vacuum deposition method.

(First Hole Transport Layer)
Copper phthalocyanine: film thickness of 10 nm
(Second Hole Transport Layer)
N,N'-diphenyl-N,N'-dinaphthylbenzidine: film thickness of 40 nm
(Light-Emitting Layer and Electron Transport Layer)
Tris(8-hydroxyquinolinato) aluminum: film thickness of 60 nm
(Electron Injection Layer)
Lithium fluoride: film thickness of 1 nm Deposition of 100 nm of metal aluminum thereon forms a negative electrode, and a silicon nitride film having a thickness of 1.5 μm was provided thereon using a plasma CVD method, with the result that the organic EL element was prepared.

Then, each of the gas barrier films produced as described above was stuck onto the prepared organic EL element through the use of a thermosetting adhesive (Epotec 310, Daizo Nichimori Co. Ltd.) such that the barrier layer were placed on the side of the organic EL element, and the adhesive was cured by heating at 65° C. for 3 hours. The organic EL element sealed in this manner was prepared, and a voltage of 7V was applied to the organic EL element to make it emit light, through the use of a source measure unit (SMU2400 type, manufactured by Keithley Inc.). When the light-emitting surface was observed with a microscope, it was found that the organic EL element sealed with the gas barrier film of the present invention uniformly emitted light without any dark spot even after it was left for 24 hours under an environment of 60° C. and 90% relative humidity.

<Preparation of Solar Battery>

A solar battery module was prepared by using the gas barrier film prepared in Example 1 described above. Specifically, ethylene-vinyl acetate copolymer of a standard cure type was used as a filler for the solar battery module. On a reinforced glass of 10 cm square, an amorphous silicon solar battery cell was sandwiched and filled by the ethylene-vinyl acetate copolymer having a thickness of 450 μm, and furthermore, the gas barrier film was stuck thereon to prepare the solar battery module. The installation conditions were vacuuming at 150° C. for 3 minutes, and then crimping for 9 minutes. The solar battery module to which the gas barrier film of the present invention was stuck was satisfactorily operable and exhibited satisfactory electrical output characteristics even under an environment of 85° C. and 85% relative humidity.

Since the gas barrier film of the present invention has a high barrier performance and a high transparency, the film can be applied to various types of electronic devices, and preferably to the sealing of the front side of an organic EL or a solar battery. Since it is possible to produce a gas barrier film having high wet heat durability, the film can be particularly preferably used for protecting an electronic device used outdoors.

While the present invention has been described in detail and with reference to specific embodiments thereof, it will be apparent to one skilled in the art that various changes and modifications can be made therein without departing from the spirit and scope thereof. All the publications referred to in the present specification are expressly incorporated herein by reference in their entirety. The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

The invention claimed is:

1. A barrier laminate comprising at least one inorganic barrier layer and at least one organic layer, wherein the organic layer is a layer formed of a polymerizable composition comprising a polymerizable compound represented by general formula (1) below;

General formula (1)

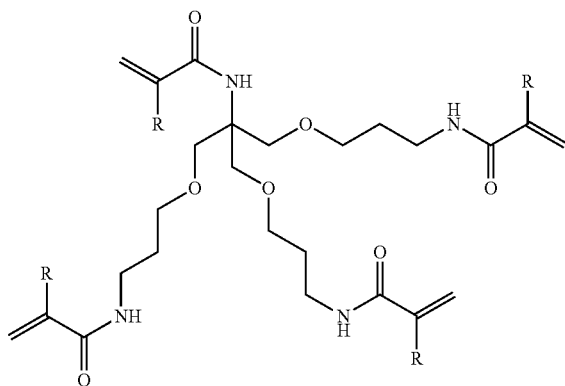

wherein R represents hydrogen atom or methyl group, and each R is the same or different to each other.

2. The barrier laminate according to claim 1, wherein each R represents hydrogen atom.

3. The barrier laminate according to claim 1, wherein the inorganic barrier layer comprises any one of metal compounds selected from a group consisting of a metal oxide, a metal nitride, a metal carbide, a metal oxynitride and a metal oxynitride carbide.

4. The barrier laminate according to claim 1, wherein the inorganic barrier layer comprises a silicon compound.

5. The barrier laminate according to claim 1, wherein the inorganic barrier layer comprises a nitride of silicon or an oxide of silicon.

6. The barrier laminate according to claim 1, wherein a proportion of the polymerizable compound relative to the total amount of polymerizable compounds in the polymerizable composition is 60 mass % or more.

7. The barrier laminate according to claim 1, wherein the organic layer and the inorganic barrier layer are adjacent to each other.

8. The barrier laminate according to claim 5, wherein the organic layer and the inorganic barrier layer are adjacent to each other.

9. A gas barrier film, wherein the barrier laminate according to claim 1 is provided on a support.

10. A gas barrier film, wherein the barrier laminate according to claim 8 is provided on a support.

11. The gas barrier film according to claim 9, wherein the support comprises a resin consisting of a polymer or a copolymer comprising a cyclic olefin within a repeating unit or a polycarbonate resin.

12. The gas barrier film according to claim 9, wherein the support is adjacent to the organic layer.

13. The gas barrier film according to claim 10, wherein the support is adjacent to the organic layer.

14. The gas barrier film according to claim 9, wherein the support and the inorganic barrier layer are adjacent to each other, and the inorganic barrier layer and the organic layer are adjacent to each other.

15. The gas barrier film according to claim 10, wherein the support and the inorganic barrier layer are adjacent to each other, and the inorganic barrier layer and the organic layer are adjacent to each other.

16. A device comprising the gas barrier film according to claim 9.

17. The device according to claim 16, wherein the device is an organic device for image display.

18. A production method of the gas barrier film according to claim 9, the method comprising applying, on the support, an application liquid that comprises a polymerizable compound represented by general formula (1) below, and water, an alkyl alcohol having 1 to 3 carbon atoms, or a mixture of water and an alkyl alcohol having 1 to 3 carbon atoms;

General formula (1)

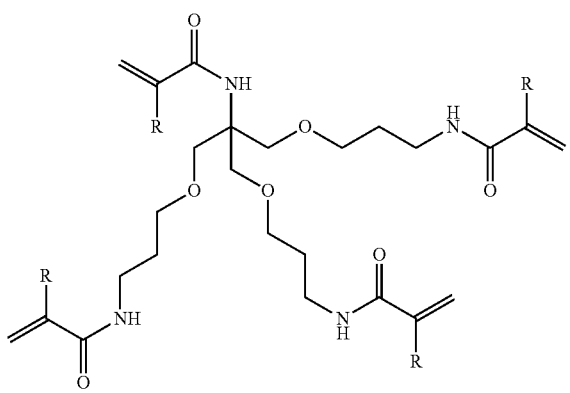

wherein R represents hydrogen atom or methyl group, and each R is the same or different to each other.

19. The production method according to claim 18, wherein each R represents hydrogen atom.

20. The production method according to claim 18, in which the application liquid comprises water and an alkyl alcohol having 1 to 3 carbon atoms.

* * * * *